(12) United States Patent
Kawasaki et al.

(10) Patent No.: US 7,154,351 B2
(45) Date of Patent: Dec. 26, 2006

(54) APPROXIMATE N-TH ORDER FUNCTION GENERATING DEVICE AND TEMPERATURE COMPENSATION CRYSTAL OSCILLATION CIRCUIT

(75) Inventors: Takako Kawasaki, Atsugi (JP); Kenji Nemoto, Sagamihara (JP)

(73) Assignee: Asahi Kasei Microsystems Co., Ltd., Tokyo (JP)

(*) Notice: Subject to any disclaimer, the term of this patent is extended or adjusted under 35 U.S.C. 154(b) by 0 days.

(21) Appl. No.: 10/523,996

(22) PCT Filed: Aug. 27, 2003

(86) PCT No.: PCT/JP03/10853

§ 371 (c)(1),
(2), (4) Date: Feb. 9, 2005

(87) PCT Pub. No.: WO2004/025824

PCT Pub. Date: Mar. 25, 2004

(65) Prior Publication Data

US 2006/0152294 A1 Jul. 13, 2006

(30) Foreign Application Priority Data

Aug. 28, 2002 (JP) ............................. 2002-248932

(51) Int. Cl.
*H03L 1/00* (2006.01)
(52) U.S. Cl. .................... 331/176; 331/66; 331/158; 331/116 R; 310/311; 310/315
(58) Field of Classification Search ................ 331/176, 331/66, 158, 116 R; 310/311, 315
See application file for complete search history.

(56) References Cited

U.S. PATENT DOCUMENTS 6,584,380 B1 6/2003 Nemoto

FOREIGN PATENT DOCUMENTS

GB 2341020 A 12/1998

(Continued)

OTHER PUBLICATIONS

Kinseki, "Temperature Compensation Circuitry of a Crystal Oscillator"; Abstract of Japanese Utility Model Application No. 65046/1987 (Laid-open No. 173909/1988), (Nov. 11, 1988).
Nemoto, "A Fully Integrated CMOS Analog TCXO"; 2001 Nen Proceedings of the Electronics, Information and Systems Conference; p. II-219—II-220; (Sep. 6, 2001).

(Continued)

*Primary Examiner*—Arnold Kinkead
(74) *Attorney, Agent, or Firm*—Finnegan, Henderson, Farabow, Garrett & Dunner, L.L.P.

(57) ABSTRACT

A circuit for generating a component of n-th order includes: six differential amplifiers (15A to 15F) having a pair of input terminals supplied with a common linear input signal and a constant level signal of a predetermined level, outputting a reversed or non-reversed signal to the linear input signal, and having a limiter function to limit the output signal to a predetermined maximum value and a minimum value; a constant level signal generation circuit for supplying the constant level signal to each of the six differential amplifiers; a current mirror circuit (14) for controlling current flowing in the differential amplifiers (15A to 15F); and addition resistors (16A, 16B) for adding the output current of the differential amplifiers (15A to 15F). By increasing the flowing current by the sixth differential amplifier (15F) so as to increase the resistance value, it is possible to obtain a highly accurate output current of a component of a 5-th order function having more precipitous inclination with respect to the input signal.

29 Claims, 19 Drawing Sheets

FOREIGN PATENT DOCUMENTS

| | | |
|---|---|---|
| JP | 63-173909 | 11/1988 |
| JP | 05-347512 | 12/1993 |
| JP | 08-116214 | 5/1996 |
| JP | 11-068461 | 3/1999 |
| JP | 2002-141426 | 5/2002 |

OTHER PUBLICATIONS

Nemoto, "Approximate Third-Order Function Generator, Temperature Compensation Quartz Oscillation Circuit Made by Using the Same, and Temperature Compensation Method", WIPO Abstract of PCT/JP98/02410, (Dec. 10, 1998).

US 7,154,351 B2

APPROXIMATE N-TH ORDER FUNCTION GENERATING DEVICE AND TEMPERATURE COMPENSATION CRYSTAL OSCILLATION CIRCUIT

TECHNICAL FIELD

The present invention relates to an approximate n-th order function generating device for generating a function of an approximate n-th order and a temperature compensation crystal oscillation circuit using the device.

BACKGROUND ART

As for a crystal resonator of an AT cut often used for a crystal oscillator, it is known that a temperature change against a fixed natural resonance frequency is represented by an approximate cubic function as shown in FIG. 17. And this temperature characteristic can be approximated as formula (1) below.

$$Y = \alpha(t-t_0)^3 \beta(t-t_0) + \gamma \tag{1}$$

Here, Y is an output frequency, $\alpha$ is a cubic coefficient, $\beta$ is a inclination of a temperature characteristic, $\gamma$ is a frequency at t0, and $t_0$ is a central temperature of a curve, that is, an inflection point (normally, a range from 25 to 30° C.). Each of $\alpha$, $\beta$ and $\gamma$ of the above formula (1) greatly depends on the crystal resonator.

For this reason, temperature compensation has been conventionally performed by using an output voltage from an approximate cubic function generating device as described in U.S. Pat. No. 3,233,946 for instance.

To be more specific, as shown in FIG. 18, the output of the approximate cubic function generating device for generating the approximate cubic function is supplied to a voltage-controlled crystal oscillator (VCXO) as a control voltage for compensating for the temperature characteristic of crystal, the device using a voltage $V_{IN}$ outputted from a temperature detecting circuit for outputting a voltage changing primarily against the temperature change as an input signal.

A voltage-frequency characteristic of the voltage-controlled crystal oscillation circuit widely applied at present can be approximated by a linear function. Therefore, the frequency characteristic against the temperature of the crystal resonator can be approximated by a voltage characteristic against the temperature as shown in FIG. 19.

A voltage-temperature characteristic of the control voltage will be as in the following formula (2).

$$f(t) = a_3(t-t_0)^3 + a_1(t-t_0) + a_0 \tag{2}$$

To be more specific, the voltage matching the control voltage in formula (2) is generated by the approximate cubic function generating device and is inputted to the voltage-controlled crystal oscillator so as to compensate for the temperature characteristic of the crystal resonator.

However, a frequency-temperature characteristic of the crystal resonator includes an order component larger than a cubic component. Therefore, there is a difference between an approximate cubic function and data so that, even if the control voltage capable of strictly compensating for the approximate cubic function is generated, this difference remains as an element for being incapable of temperature compensation.

To solve this, it is possible to approximate the temperature characteristic of the crystal resonator with a function of a higher order and control the voltage-controlled crystal oscillator with a voltage of a function of a high order corresponding thereto so as to reduce the difference.

For instance, in the case of approximating frequency-temperature characteristic data on one crystal resonator with a cubic function, the difference between an approximate expression and the data is 0.320 ppm at the maximum in a temperature range of −30 to 85° C. If this is approximated with a function of a fourth order, it becomes 0.130 ppm. And if further approximated with a function of a fifth order, it becomes 0.126 ppm. It is thus possible to adjust the coefficient and generate the control voltage by using a device for generating the functions of higher orders so as to perform the temperature compensation with a higher order of accuracy.

As for a circuit for outputting a signal proportional to the functions cubic or of higher orders so far, a function generating device shown in FIG. 1 of Japanese Patent Laid-Open No. 8-116214 is known for instance.

The signal outputted from this circuit can be represented as a polynomial such as formula (3) below which is a general expression.

$$\begin{aligned} f(x) &= a_n x^n + a_{n-1} x^{n-1} + \ldots + a_2 x^2 + a_1 x + a_0 \\ &= a_n'(x-x_0)^n + \ldots + a_1'(x-x_0) + a_0' \end{aligned} \tag{3}$$

For instance, an output signal of a fourth order function generating device can be represented by formula (4) below.

$$\begin{aligned} f(x) &= a_4 x^4 + a_3 x^3 + a_2 x^2 + a_1 x + a_0 \\ &= a_4'(x-x_0)^4 + a_2'(x-x_0)^2 + a_1'(x-x_0) + a_0' \end{aligned} \tag{4}$$

However,
$a_4' = a_4, a_2' = a_2 - 6a_4 x_0^2$, $a_1' = a_1 + 2a_2 x_0 - 8a_4 x_0^3$, $a_0' = a_0 + a_1 x_0 + a_2 x_0^2 - 3a_4 x_0^4$, $x_0 = -a_3/(4a_4)$ As for the approximate fourth order function generating device, it is possible, by using $x_0$ as in the above formula (4), to omit an n−$1^{st}$ term, that is a cubic term and also reduce a circuit size.

However, the conventional example has an unsolved problem that it is difficult to implement the circuit for generating the control voltage with a configuration as in the formula (4).

The unsolved problem will be described by using a concrete example. If the frequency-temperature characteristic data on one crystal resonator is described first as a formula having the cubic term omitted as the formula (4), to representing the inflection point of this function becomes −149° C. to significantly exceed the normally compensated range of −30 to 85° C. A significant deviation of to means that the circuit must have a wide input range of a functional circuit for generating the control voltage equivalent thereto and must be the circuit having the temperature outside an adjustment range taken into consideration. FIG. 20 shows the order components, where it is understandable that, while the frequency-temperature characteristic of one crystal resonator is within ±10 ppm, the order components have the functions a significant deflection width of ±1500 ppm at the maximum added thereto. Therefore, to compensate for the frequency-temperature characteristic of the crystal resonator, the adjustment range of the coefficients $a_4'$ to $a_0'$ of the orders must be wide for the control voltage, and the circuit for implementing this becomes very disadvantageous as a dynamic range. Consequently, there arise the problems of significant increase in noise and expansion of the circuit size due to extension of the control voltage from the cubic function to the function of the fourth order. Thus, it is not practical even when considering a merit of obtaining a higher order of accuracy.

Consequently, the present invention has been implemented by noting the unsolved problems of the conventional example. And an object thereof is to provide the circuit capable of accurately providing high order components which are cubic or of higher orders and an accurately adjustable crystal oscillator using the function generating device thereof for the temperature compensation.

DISCLOSURE OF THE INVENTION

A k-th order component generating circuit according to claim 1 of the present invention is characterized by comprising: a plurality i (i is an integer of 5 or more) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant level signal generating circuit for providing the constant level signal to each of the i differential amplifiers, wherein: first, second and third differential amplifiers of the i differential amplifiers are set to have the constant level signals at increasingly higher levels inputted in order; the output signals of the first and third differential amplifiers and those of the second differential amplifier are set to be of mutually reverse polarity; a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier; each of (i–4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i–4) differential amplifiers and those of the second differential amplifier are set to be of mutually reverse polarity, thus constituted to form the output signal of the component of a k-th order function (k is an odd number of 3 or more) on adding up the output signals of the first, second, third and (i–4) differential amplifiers; and the fourth differential amplifier is constituted to form the output signal of a linear component for offsetting the linear component of the k-th order function component so as to generate the component of the k-th order function including no linear component by adding the output signals of the i differential amplifiers.

According to this, it is possible, by adjusting energization currents of the (i–4) differential amplifiers, to form the output signal of a inclination more precipitous against the input signal in the range in which the input signal is larger than the maximum value or smaller than the minimum value so as to generate an approximate k-th order function (k is an odd number of 3 or more) with high accuracy.

The cubic order component generating circuit according to claim 2 of the present invention is characterized by being set as i=5 and k=3 in claim 1.

Thus, it is possible to constitute a cubic-specific circuit out of the circuits for generating an odd-numbered component of k-th order so as to output a cubic function with high accuracy.

The cubic order component generating circuit according to claim 3 of the present invention is characterized in that, in claim 2, a fifth differential amplifier has the constant level signal to be inputted set to be lower than the level of the constant level signal to be inputted to the first differential amplifier and also has the range of the input signal to be the maximum value and the input signal to be the minimum value set smaller than that of the first differential amplifier.

Thus, it is possible to output the cubic function with high accuracy in the case of expanding a range of input voltage only to a higher side from an inflection point of the input voltage.

The cubic order component generating circuit according to claim 4 of the present invention is characterized in that the fifth differential amplifier has the constant level signal to be inputted set to be higher than the level of the constant level signal to be inputted to the third differential amplifier and also has the range of the input signal to be the maximum value and the input signal to be the minimum value set smaller than that of the third differential amplifier.

Thus, it is possible to output the cubic function with high accuracy in the case of expanding the range of input voltage only to a lower side from the inflection point of the input voltage.

The k-th order component generating circuit according to claim 5 of the present invention is characterized by being set as i=6 and k=5 in claim 1.

Thus, it is possible to constitute a circuit specialized in fifth order out of the circuits for generating an odd-numbered component of k-th order so as to output a fifth order function with high accuracy.

A fifth order component generating circuit according to claim 6 of the present invention is characterized in that, in claim 5, the fifth differential amplifier has the constant level signal to be inputted set to be lower than the level of the constant level signal to be inputted to the first differential amplifier and also has the range of the input signal to be the maximum value and the input signal to be the minimum value set smaller than that of the first differential amplifier, and the sixth differential amplifier has the constant level signal to be inputted set to be higher than the level of the constant level signal to be inputted to the third differential amplifier and also has the range of the input signal to be the maximum value and the input signal to be the minimum value set smaller than that of the third differential amplifier.

Thus, it is possible to output the fifth order function with high accuracy in the case of expanding the range of input voltage only to a higher side from an inflection point.

An m-th order component generating circuit according to claim 7 of the present invention is characterized by comprising: a plurality j (j is an integer of 4 or more) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant signal outputting circuit for outputting a constant output signal; a constant level signal generating circuit for providing the constant level signal to each of the j differential amplifiers, wherein: first, second, third and fourth differential amplifiers of the j differential amplifiers are set to have the constant level signals at increasingly higher levels inputted in order; the output signals of the first and second differential amplifiers and those of the third and fourth differential amplifiers are set to be of mutually reverse polarity, thus constituted to form the output signal of the component of an m-th order function (m is an even number of 4 or more) on adding up the output signals of the j differential amplifiers; and the constant signal outputting circuit is constituted to form the output signal of a 0-th order component for offsetting the 0-th order component of the m-th order function component so as to generate the component of the m-th order function including no 0-th order component by adding the output signals of the j differential amplifiers and the constant signal outputting circuit.

Thus, it is possible to generate an even-numbered component of m-th order including no 0-th order component with high accuracy.

The m-th order component generating circuit according to claim 8 of the present invention is characterized in that, in claim 7, j is an even number of 6 or more, and each of (j−4) differential amplifiers other than the first, second, third and fourth differential amplifiers of the j differential amplifiers has the constant level signal to be inputted set to be either lower than a level of the constant level signal to be inputted to the first differential amplifier or higher than a level of the constant level signal to be inputted to the fourth differential amplifier.

Thus, it is possible, by adjusting energization currents of the (j−4) differential amplifiers, to form the output signal of a inclination more precipitous against the input signal in the range in which the input signal is larger than the maximum value or smaller than the minimum value so as to generate an approximate m-th order function with high accuracy.

The fourth order component generating circuit according to claim 9 of the present invention is characterized by being set as j=4 and m=4 in claim 7.

Thus, it is possible to constitute a circuit specialized in the fourth order out of the circuits for generating an even-numbered component of m-th order so as to output a fourth order function with high accuracy.

An approximate n-th order function generating device according to claim 10 of the present invention is characterized by comprising: a 0-th order component generating portion for having a constant signal inputted and generating a constant component; a linear component generating portion for having a linear input signal inputted and generating a linear component; at least one k-th order component generating portion having a k-th order component (k is an odd number of 3 or more) generating circuit for having the linear input signal inputted and a first variable gain amplifying circuit for having an output signal of the k-th order component generating circuit inputted; at least one m-th order component generating portion having an m-th order component (m is an even number of 4 or more) generating circuit for having the linear input signal inputted and a second variable gain amplifying circuit for having an output signal of the m-th order component generating circuit inputted; and an adding circuit for adding the output signals of the 0-th order component generating portion, the linear component generating portion, the k-th order component generating portion and the m-th order component generating portion, wherein an approximate n-th order function (n is an integer of 4 or more) is generated.

Thus, it is possible to render the cubic component main by omitting a second order term and use an inflection point $x_0$ close to the inflection point thereof. It is also possible, as the component of n-th order in n≧4 other than cubic becomes smaller, to use the common inflection point $x_0$ as a configuration and implement the configuration of offset+linear component+cubic component+corrective high order component so that influence on a circuit size can be reduced.

An approximate n-th order function generating device according to claim 11 of the present invention is characterized by comprising: a 0-th order component generating portion for having a constant signal inputted and generating a constant component; a linear component generating portion for having a linear input signal inputted and generating a linear component; at least one k-th order component generating portion having a k-th order component (k is an odd number of 3 or more) generating circuit according to claim 1 for having the linear input signal inputted and a first variable gain amplifying circuit for having an output signal of the k-th order component generating circuit inputted; at least one m-th order component generating portion having an m-th order component (m is an even number of 4 or more) generating circuit according to claim 7 for having the linear input signal inputted and a second variable gain amplifying circuit for having an output signal of the m-th order component generating circuit inputted; and an adding circuit for adding the output signals of the 0-th order component generating portion, the linear component generating portion, the k-th order component generating portion and the m-th order component generating portion, wherein an approximate n-th order function (n is an integer of 4 or more) is generated.

Thus, it is possible to render the cubic component capable of accurate generation main by omitting the second order term and use the inflection point $x_0$ close to the inflection point thereof. It is also possible, as the component of n-th order in n≧4 other than cubic becomes smaller, to use the common inflection point $x_0$ as the configuration and implement the configuration of offset+linear component+cubic component+corrective high order component so that the influence on the circuit size can be reduced.

An approximate cubic function generating device according to claim 12 of the present invention is characterized by comprising: a 0-th order component generating portion for having a constant input signal inputted and generating a constant component; a linear component generating portion for having a linear input signal inputted and generating a linear component; a cubic component generating portion having a cubic component generating circuit according to either claim 2 or claim 4 for having the linear input signal inputted and a first variable gain amplifying circuit for having an output signal of the cubic component generating circuit inputted; and an adding circuit for adding the output signals of the 0-th order component generating portion, the linear component generating portion and the cubic component generating portion.

Thus, it is possible to generate an approximate cubic function with high accuracy.

An approximate fourth order function generating device according to claim 13 of the present invention is characterized by comprising: a 0-th order component generating portion for having a constant input signal inputted and generating a constant component; a linear component generating portion for having a linear input signal inputted and generating a linear component; a cubic component generating portion having a cubic component generating circuit according to either claim 2 or claim 4 for having the linear input signal inputted and a first variable gain amplifying circuit for having an output signal of the cubic component generating circuit inputted; a fourth order component generating portion having a fourth order component generating circuit according to claim 9 for having the linear input signal inputted and a second variable gain amplifying circuit for having an output signal of the fourth order component generating circuit inputted; and an adding circuit for adding the output signals of the fourth order component generating portion, the cubic component generating portion, the linear component generating portion and the 0-th order component generating portion.

Thus, it is possible to generate an approximate fourth order function with high accuracy.

An approximate fifth order function generating device according to claim 14 of the present invention is characterized by comprising: a 0-th order component generating portion for having a constant input signal inputted and generating a constant component; a linear component generating portion for having a linear input signal inputted and generating a linear component; a cubic component generating portion having a cubic component generating circuit according to either claim 2 or claim 4 for having the linear input signal inputted and a first variable gain amplifying circuit for having an output signal of the cubic component generating circuit inputted; a fourth order component generating portion having a fourth order component generating circuit according to claim 9 for having the linear input signal inputted and a second variable gain amplifying circuit for having an output signal of the fourth order component generating circuit inputted; a fifth order component generating portion having a fifth order component generating circuit according to claim 5 or 6 for having the linear input signal inputted and a third variable gain amplifying circuit for having an output signal of the fifth order component generating circuit inputted; and an adding circuit for adding the output signals of the fifth order component generating portion, the fourth order component generating portion, the cubic component generating portion, the linear component generating portion and the 0-th order component generating portion.

Thus, it is possible to generate an approximate fifth order function with high accuracy.

An approximate n-th order function generating device according to claim 15 of the present invention is characterized by having the linear input signal inputted, outputting an n-th output signal proportional to an n-th order function represented by an n-th order polynomial and including no second order term in the n-th order polynomial.

Thus, it is possible to render the cubic component main and use the inflection point $x_0$ close to the inflection point thereof. It is also possible, as the component of n-th order in $n \geq 4$ other than cubic becomes smaller, to use the common inflection point $x_0$ as the configuration and implement the configuration of offset+linear component+cubic component+corrective high order component so that the influence on the circuit size can be reduced.

A temperature function generating circuit according to claim 16 of the present invention is characterized by comprising a temperature detecting circuit and the approximate n-th order function generating device according to claim 15 for having a detection signal of the temperature detecting circuit inputted.

Thus, it is possible to constitute the temperature function generating circuit capable of supplying the detection signal of the temperature detecting circuit as the input signal to the approximate n-th order function generating device and generating a voltage capable of correcting a temperature characteristic of crystal.

A temperature compensation crystal oscillation circuit according to claim 17 of the present invention is characterized by comprising the temperature function generating circuit according to claim 16 and a crystal oscillation circuit for having the approximate n-th order function generated in the temperature function generating circuit inputted.

Thus, it is possible to constitute the temperature compensation crystal oscillation circuit capable of performing temperature compensation with high accuracy.

A temperature function generating circuit according to claim 18 of the present invention is characterized by comprising a temperature detecting circuit and the approximate n-th order function generating device according to claim 10 or 11 for having a detection signal of the temperature detecting circuit inputted.

Thus, it is possible to constitute the temperature function generating circuit capable of generating the voltage for correcting the temperature characteristic of crystal by using the approximate n-th order function generating device with high accuracy.

A temperature compensation crystal oscillation circuit according to claim 19 of the present invention is characterized by comprising the temperature function generating circuit according to claim 18 and a crystal oscillation circuit for having the approximate n-th order function generated in the temperature function generating circuit inputted.

Thus, it is possible to constitute the temperature compensation crystal oscillation circuit capable of performing the temperature compensation with high accuracy.

A temperature function generating circuit according to claim 20 of the present invention is characterized by comprising a temperature detecting circuit and the approximate cubic function generating device according to claim 12 for having a detection signal of the temperature detecting circuit inputted.

Thus, it is possible to constitute the temperature function generating circuit specialized in the cubic function.

A temperature compensation crystal oscillation circuit according to claim 21 of the present invention is characterized by comprising the temperature function generating circuit according to claim 20 and a crystal oscillation circuit for having the approximate cubic function generated in the temperature function generating circuit inputted.

Thus, it is possible to constitute the temperature compensation crystal oscillation circuit specialized in the cubic function.

A temperature function generating circuit according to claim 22 of the present invention is characterized by comprising a temperature detecting circuit and the approximate fourth order function generating device according to claim 13 for having a detection signal of the temperature detecting circuit inputted.

Thus, it is possible to constitute the temperature function generating circuit specialized in the fourth order function.

A temperature compensation crystal oscillation circuit according to claim 23 of the present invention is characterized by comprising the temperature function generating circuit according to claim 22 and a crystal oscillation circuit for having the approximate fourth order function generated in the temperature function generating circuit inputted.

Thus, it is possible to constitute the temperature compensation crystal oscillation circuit specialized in the fourth order function.

A temperature function generating circuit according to claim 24 of the present invention is characterized by comprising a temperature detecting circuit and the approximate fifth order function generating device according to claim 14 for having a detection signal of the temperature detecting circuit inputted.

Thus, it is possible to constitute the temperature function generating circuit specialized in the fifth order function.

A temperature compensation crystal oscillation circuit according to claim 25 of the present invention is characterized by comprising the temperature function generating circuit according to claim 24 and a crystal oscillation circuit for having the approximate fifth order function generated in the temperature function generating circuit inputted.

Thus, it is possible to constitute the temperature compensation crystal oscillation circuit specialized in the fifth order function.

A temperature compensation adjustment method according to claim 26 of the present invention is characterized in that, when making a temperature compensation adjustment to a temperature compensation crystal oscillation circuit comprised of a temperature compensation circuit including a temperature detecting circuit and an approximate n-th order function generating device (n is an integer of 3 or more) and a voltage-controlled crystal oscillation circuit, a measurement is made on an n-th order component $VC_{OUTn}$ to a 0-th order component $VC_{OUT0}$ of an output voltage $VC_{OUT}$ of the temperature compensation circuit in a predetermined temperature atmosphere, and measurements are also made, at a plurality of temperatures in a desired temperature compensation range, on an input voltage $VC_{IN}$ at which an oscillating frequency outputted from the voltage-controlled crystal oscillation circuit matches a preset selected frequency, and the n-th order component $VC_{OUTn}$ of the output voltage $VC_{OUT}$ measured at each temperature is approximated as a function of a temperature T by:

$$VC_{OUTn}'(T) = VC_{OUTn}(T) - VC_{OUT0}(T),$$

and the output voltage $VC_{OUT}$ is described as a function of the temperature T by:

$$VC_{OUT}(T) = \alpha_n VC'_{OUTn}(T + \Delta T) + \ldots +$$
$$\alpha_3 VC'_{OUT3}(T + \Delta T) + \alpha_1 VC'_{OUT1}(T + \Delta T) + VC'_{OUT0}(T + \Delta T) + \alpha_0,$$

and coefficients $\alpha_n$ to $\alpha_3$, $\alpha_1$, $\alpha_0$ and $\Delta T$ of the temperature compensation circuit are adjusted so that the input voltage $VC_{IN}$ and output voltage $VC_{OUT}$ measured at each of the temperatures are matching.

Thus, it is possible to obtain an effect of allowing the temperature compensation with high accuracy. In addition, it is possible to obtain detailed and correct data by measuring the orders individually. And it is possible to calculate more optimal coefficients based on actual data by considering errors other than those of the components of the orders. Furthermore, it is possible to accurately adjust the temperature compensation by one temperature sweep not only on an approximate cubic function circuit but also on an approximate n-th function generating circuit in $n \geq 4$.

BEST MODE FOR CARRYING OUT THE INVENTION

Hereafter, embodiments of the present invention will be described based on drawings.

First, a description will be given as to a principle of an approximate n-th order function generating device of the present invention.

An n-th order function may be generally represented as in formula (5) below.

$$f(x) = a_n x^n + a_{n-1} x^{n-1} + \ldots + a_3 x^3 + a_2 x^2 + a_1 x + a_0 \quad (5)$$
$$= a'_n (x - x_0)^n + a'_{n-1} (x - x_0)^{n-1} + \ldots +$$
$$a'_3 (x - x_0)^3 + a'_1 (x - x_0) + a'_0$$

As a concrete example, a fifth order function may be represented as in formula (6) below.

$$f(x) = a_5 x^5 + a_4 x^4 + a_3 x^3 + a_2 x^2 + a_1 x + a_0 \quad (6)$$
$$= a'_5 (x - x_0)^5 + a'_4 (x - x_0)^4 + a'_3 (x - x_0)^3 + a_1 (x - x_0) + a'_0$$

In this formula (6), relations among coefficients are as follows.
$a_5' = a_5$
$a_4' = a_4 + 5a_5 x_0$
$a_3' = a_3 + 4a_4 x_0 + 10a_5 x_0^2$
$a_1' = a_1 - 3a_3 x_0 - 8a_4 x_0^3 - 15a_5 x_0^4$
$a_0' = a_0 + a_1 x_0 - 2a_3 x_0^3 - 5a_4 x_0^4 - 9a_5 x_0^5$ However, $x_0$ is a solution to the following cubic equation.

$$10 a_5 x_0^3 + 6 a_4 x_0^2 + 3 a_3 x_0 + a_2 = 0$$

As for this $x_0$, one solution or three solutions can be obtained so that a value close to an assumed value should be selected $x_0$ in the formula (6) becomes "29" due to this conversion, which is approximately equal to an inflection point on approximating the same data to a cubic function near a center of a normally compensated temperature range. Therefore, it becomes advantageous as a circuit configuration in that a cubic component is a main component while fourth and fifth order components become smaller.

And a fourth order function may be represented as in formula (7) below.

$$f(x) = a_4 x^4 + a_3 x^3 + a_2 x^2 + a_1 x + a_0 \quad (7)$$
$$= a'_4 (x - x_0)^4 + a'_3 (x - x_0)^3 + a_1 (x - x_0) + a'_0$$

In this formula (7), the relations among the coefficients are as follows.
$a_4' = a_4$
$a_3' = a_3 + 4a_4 x_0$
$a_1' = a_1 - 3a_3 x_0^2 - 8a_4 x_0^3$
$a_0' = a_0 + a_1 x_0 - 2a_3 x_0^3 - 5a_4 x_0^4$ However, $x_0$ is a solution to the following quadratic equation.

$$6 a_4 x_0^2 + 3 a_3 x_0 + a_2 = 0$$

Figure 21:
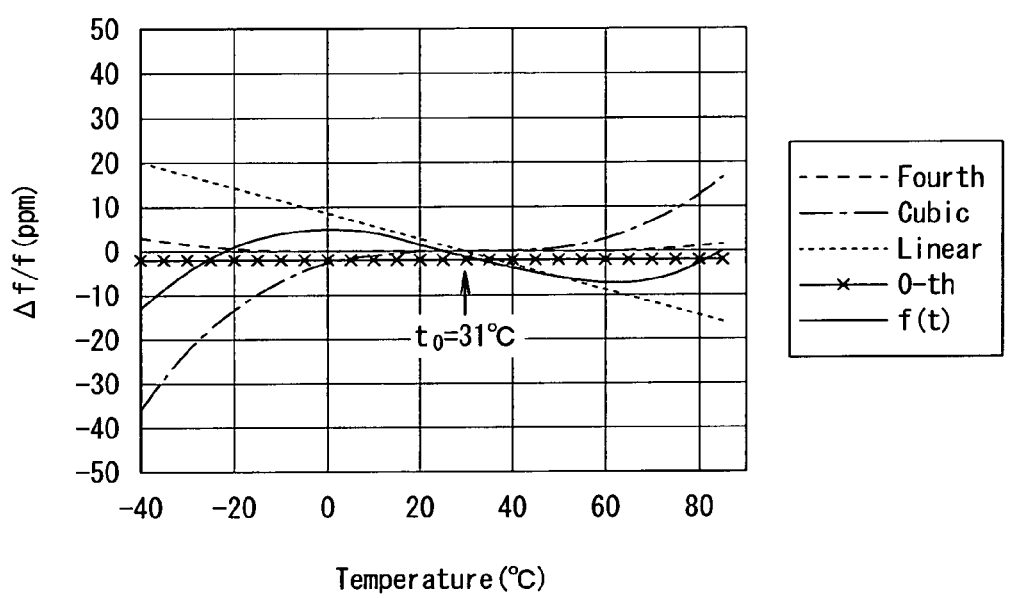
FIG. 21 is a characteristic diagram showing characteristics of an approximate expression of the present invention.

As for this $x_0$, two solutions can be obtained so that a value closer to the center of a curve should be selected. Consequently, $x_0$ is "31" which is approximately equal to the inflection point on approximating the same data to the cubic function near the center of the normally compensated temperature range. Furthermore, the orders when represented in formula (7) as described above can be illustrated as in FIG. 21 so that the fourth order component is within ±3 ppm. Thus, if represented in a formula having no second order component such as the formula (6) or (7), the main components are the cubic components and linear components and only a few high order components having the inflection points approximately equal to the inflection points of the cubic components are added. It is a very advantageous configuration as a dynamic range of a circuit for generating control voltage equivalent to this.

Figure 1:
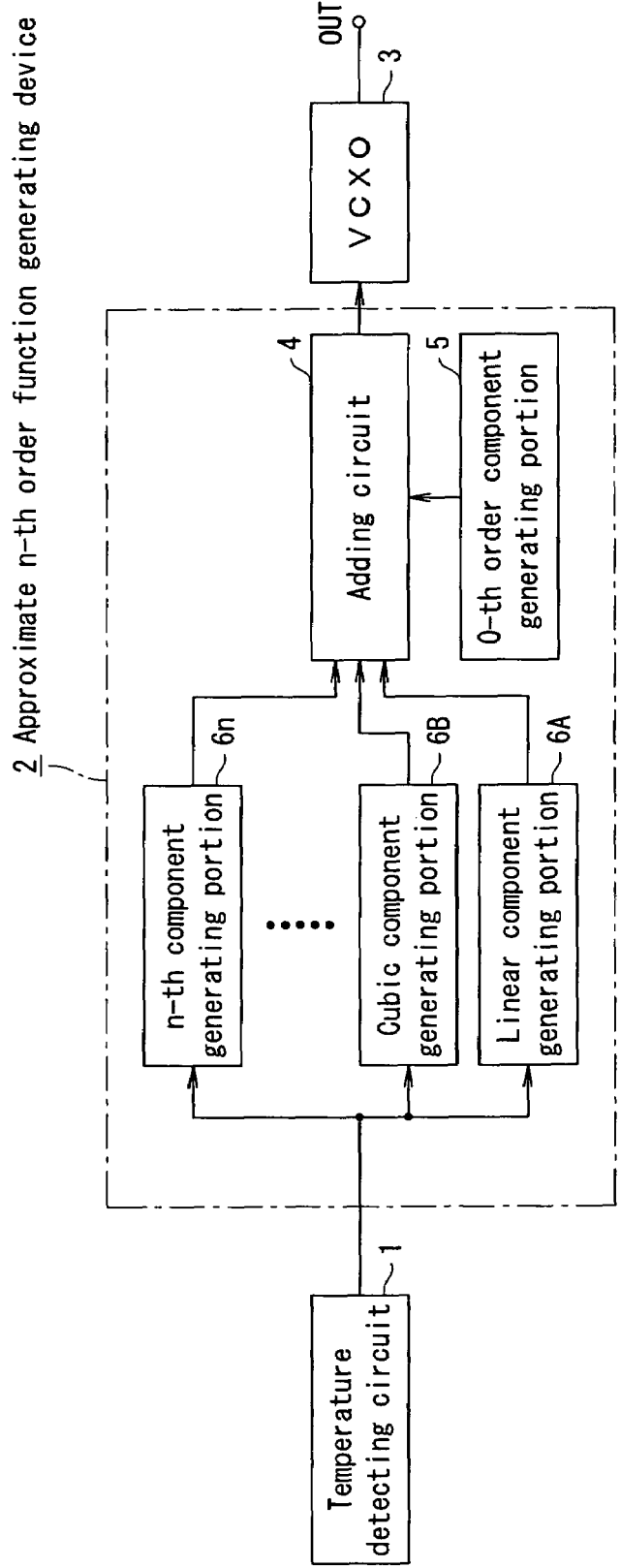
FIG. 1 is a block diagram showing an embodiment in the case of applying the present invention to a temperature compensation crystal oscillation circuit.

FIG. 1 is a block diagram showing an embodiment of a temperature compensation crystal oscillation circuit according to the present invention.

In FIG. 1, reference numeral 1 denotes a temperature detecting circuit of which analog output voltage changes linear-functionally against a temperature change. And a detected temperature value due to an analog voltage outputted from the temperature detecting circuit 1 is inputted as an input signal $V_{IN}$ to an approximate n-th order function generating device 2 to generate a voltage for compensating a temperature characteristic of crystal so as to supply it to a voltage-controlled crystal oscillator (VCXO) 3.

Here, the approximate n-th order function generating device 2 generates the voltage represented by the n-th order function of the aforementioned formula (5). It has the input signal $V_{IN}$ inputted, and based thereon, it is comprised of an n-th component generating portion 6n for generating only the n-th component of a first term in the aforementioned formula (5), a cubic component generating portion 6B for generating only the cubic component of an n–2 term in formula (5), a linear component generating portion 6A for generating only the linear component of an n–1 term in formula (5) and an adding circuit 4 for adding output signals of the n-th component generating portion 6n, cubic component generating portion 6B and linear component generating portion 6A.

The approximate n-th order function generating device 2 can have n set at an arbitrary high order. For a concrete example, the temperature compensation crystal oscillation circuit is constituted by applying an approximate fifth order function generating device 2A shown in FIG. 2 or an approximate fourth order function generating device shown in FIG. 3.

Figure 2:
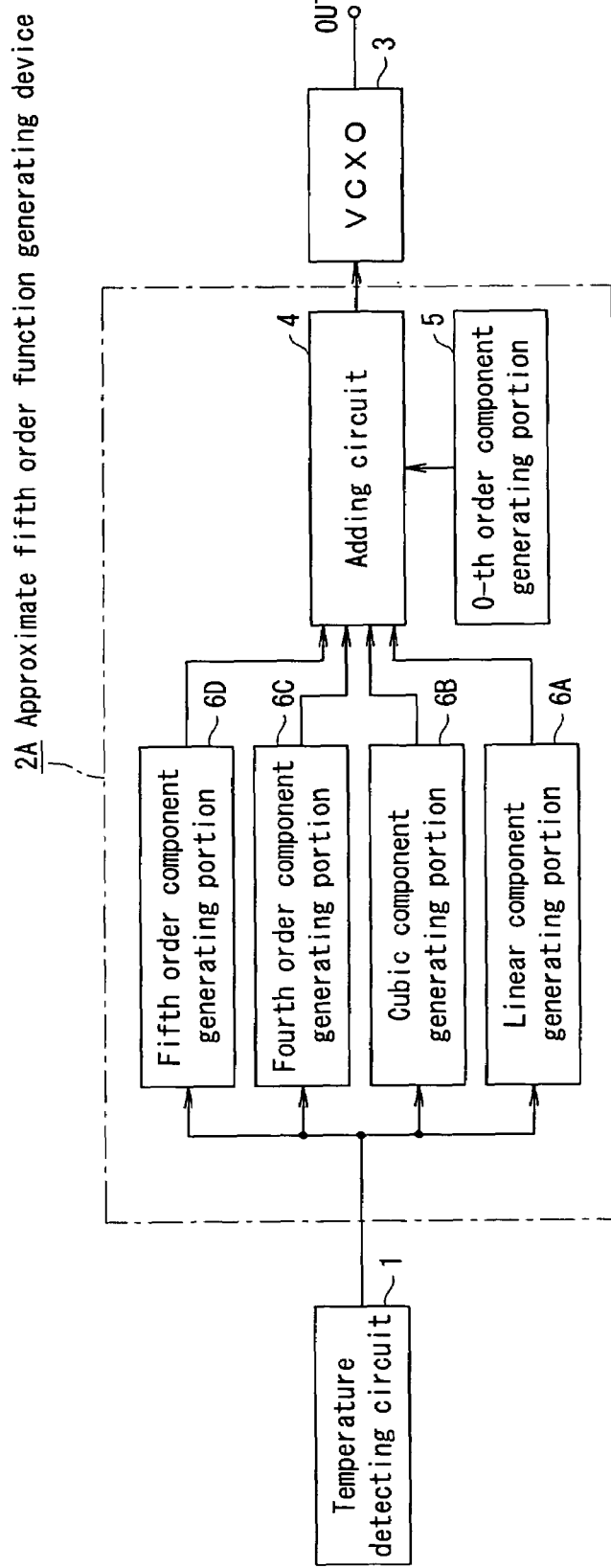
FIG. 2 is a block diagram showing a concrete example of the temperature compensation crystal oscillation circuit to which an approximate fifth order function generating device is applied.

To be more specific, as to the temperature compensation crystal oscillation circuit in FIG. 2, the approximate fifth order function generating device 2A has a fourth order component generating portion 6C and a fifth order component generating portion 6D provided thereto in addition to the adding circuit 4, 0-th order component generating portion 5, linear component generating portion 6A and cubic component generating portion 6B in the aforementioned configuration in FIG. 1, where the output signals of the linear component generating portion 6A, cubic component generating portion 6B, fourth order component generating portion 6C and fifth order component generating portion 6D are added by the adding circuit 4.

Figure 3:
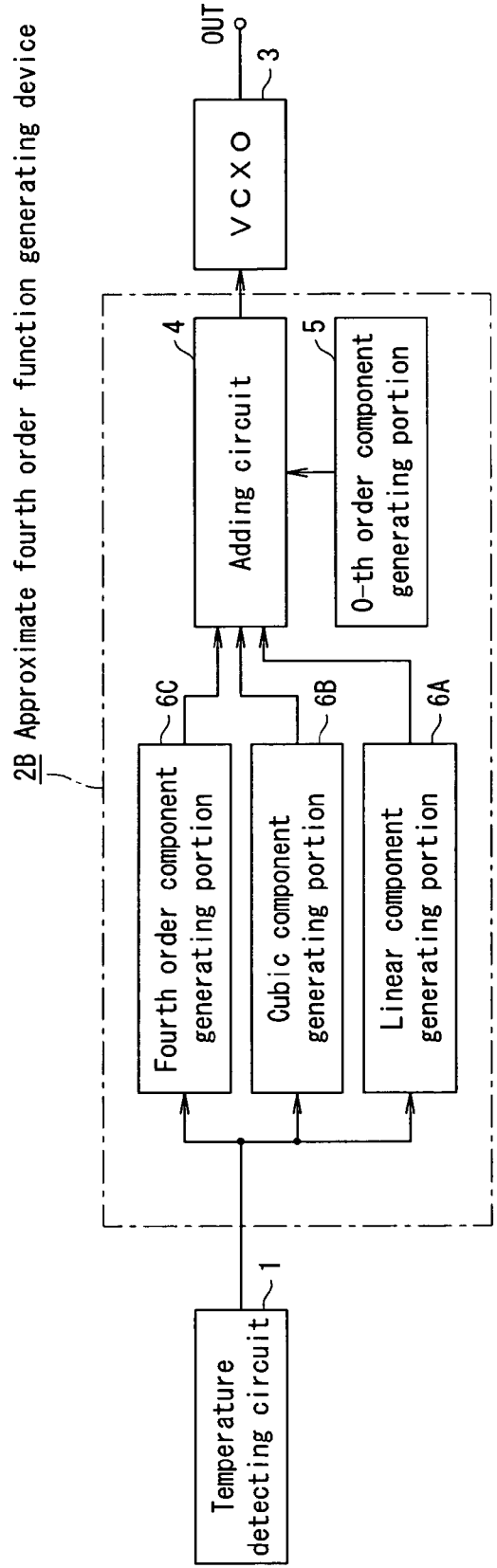
FIG. 3 is a block diagram showing a concrete example of the temperature compensation crystal oscillation circuit to which an approximate fourth order function generating device is applied.

As for the temperature compensation crystal oscillation circuit in FIG. 3, the approximate fourth order function generating device 2B is constituted by omitting the fifth order component generating portion 6D in the configuration in FIG. 2.

Figure 4:
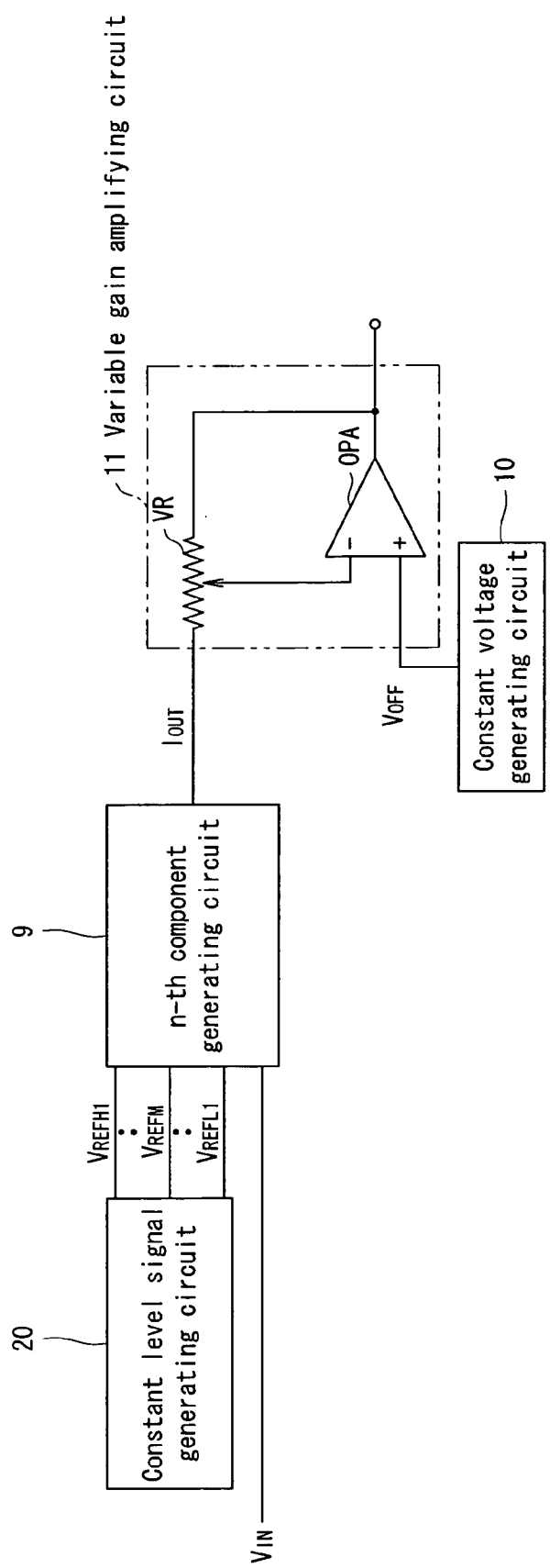
FIG. 4 is a circuit diagram showing an example of an n-th component generating portion in FIG. 1.

As shown in FIG. 4, each of the cubic component generating portion 6B, fourth order component generating portion 6C, fifth order component generating portion 6D . . . and n-th component generating portion 6n in FIGS. 1 to 3 is comprised of an n-th component generating circuit 9 for generating only each order component of the cubic, fourth order, fifth order . . . n-th order components, a variable gain amplifying circuit 11 for having an output of the n-th component generating circuit 9 inputted and a constant level signal generating circuit 20 for providing constant level signals $V_{REFL1}$ to $V_{REFH2}$ mentioned later to the n-th component generating circuit 9.

Figure 5:
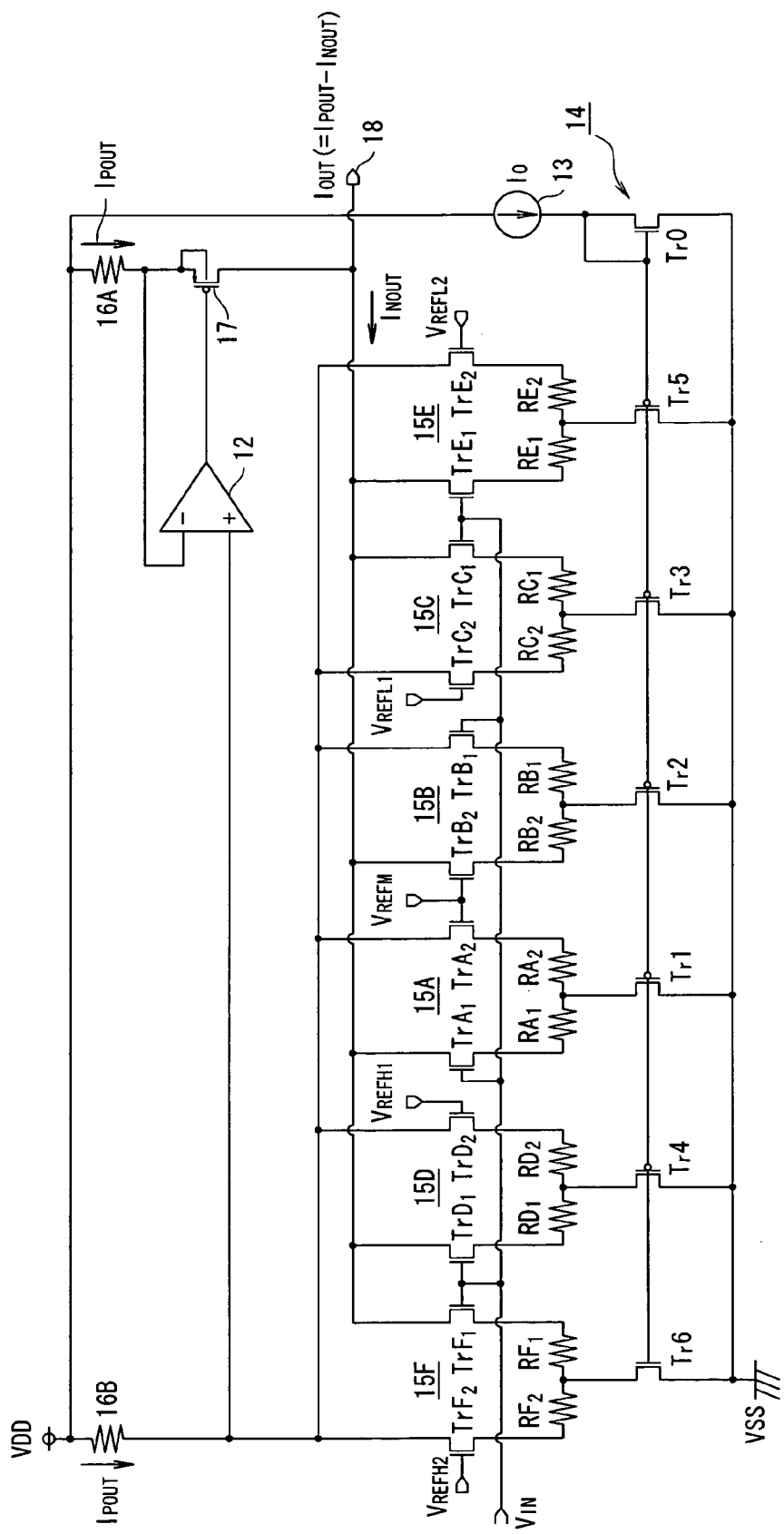
FIG. 5 is a circuit diagram showing an example of a fifth order component generating circuit applicable to FIG. 4.

Here, a fifth order component generating circuit will be described as an example of an odd function. As shown in FIG. 5, the fifth order component generating circuit is comprised of a current mirror circuit 14 comprising a MOS field-effect transistor Tr0 having a gate and a drain connected to a positive power terminal VDD via a constant current source 13 and having the source grounded to a VSS and six MOS field-effect transistors Tr1 to Tr6 having their respective gates connected to the gate of the MOS field-effect transistor Tr0, six differential amplifiers 15A to 15F constituting first to sixth amplifiers to which a constant current is supplied from the current mirror circuit 14, resistances 16A and 16B having the same resistance value for constituting an adder for adding output currents of the differential amplifiers 15A to 15F, and a differential amplifier 12 for obtaining a current difference of the output. The differential amplifiers 15A to 15F are supplied with different constant level reference voltages $V_{REFH1}$, $V_{REFH2}$, $V_{REFM}$, $V_{REFL2}$ and $V_{REFL1}$ from the constant level signal generating circuit 20.

Here, the differential amplifier 15A has MOS field-effect transistors $TrA_1$ and $TrA_2$ serially connected to the drain of the MOS field-effect transistor Tr1 of the current mirror circuit 14 via resistances $RA_1$ and $RA_2$ respectively. The input signal $V_{IN}$ is supplied to the gate of the transistor $TrA_1$, and the constant level reference voltages $V_{REFM}$ is supplied to the gate of the transistor $TrA_2$, and the drain of the transistor $TrA_1$ is connected to the positive power terminal VDD via one of the resistances 16A constituting the adder and an MOS field-effect transistor 17 for receiving the output of the differential amplifier 12 on its gate while the drain of the transistor $TrA_2$ is connected to the positive power terminal VDD via the other resistance 16B constituting the adder.

Likewise, the differential amplifier 15B also has MOS field-effect transistors $TrB_1$ and $TrB_2$ serially connected to the drain of the MOS field-effect transistor Tr1 of the current mirror circuit 14 via resistances $RB_1$ and $RB_2$ respectively. The input signal $V_{IN}$ is supplied to the gate of the transistor $TrB_1$, and the constant level reference voltages $V_{REFM}$ is supplied to the gate of the transistor $TrB_2$. As is contrary to the aforementioned differential amplifier 15A, however, the drain of the transistor $TrB_1$ is connected to the positive power terminal VDD via the other resistance 16B constituting the adder while the drain of the transistor $TrB_2$ is connected to the positive power terminal VDD via the MOS field-effect transistor 17 and one of the resistances 16A constituting the adder so as to have reverse characteristics to the other differential amplifiers 15A, 15C, 15D, 15E and 15F.

The differential amplifiers 15C, 15D, 15E and 15F also have the same configuration as the differential amplifier 15A, and have the constant level reference voltages $V_{REFL1}$, $V_{REFH1}$, $V_{REFL2}$ and $V_{REFH2}$ generated by the constant level signal generating circuit 20 inputted respectively. And the MOS field-effect transistors $TrA_1$, $TrB_2$, $TrC_1$, $TrD_1$, $TrE_1$ and $TrF_1$ are connected to the resistance 16A constituting the adder via the MOS field-effect transistor 17 with their connection points connected to an inverting input side of the differential amplifier 12.

Sizes of the constant level reference voltages $V_{REFH1}$ to $V_{REFL1}$ supplied to the differential amplifiers 15A to 15F are set as $V_{REFH2} > V_{REFH1} > V_{REFM} > V_{REFL1} > V_{REFL2}$, and the differential amplifier 15B also has the constant level reference voltage $V_{REFM}$ of the same voltage as the differential amplifier 15A supplied thereto.

And a difference current between a normal rotation output current $I_{POUT}$ passing through the resistances 16A and 16B and an inverting output current $I_{NOUT}$ passing through a ground VSS via the MOS field-effect transistors $TrA_1$ to $TrF_1$, resistances $RA_1$ to $RF_1$ and MOS field-effect transistors Tr1 to Tr6 of the differential amplifiers 15A to 15F is outputted as an output current $I_{OUT}$ from an output terminal 18 of the fifth order component generating circuit. The output current $I_{OUT}$ is supplied to the inverting input side of an operational amplifier OPA having a variable resistance VR inserted via a negative feedback constituting the variable gain amplifying circuit 11. A constant voltage $V_{OFF}$ generated by a constant voltage generating circuit 10 is supplied to a normal rotation input side of the operational amplifier OPA, and it is possible to obtain an output $V5_{OUT}$ of only the fifth order component including no linear component as represented by formula (8) below.

$$V5_{OUT} = B5(V_{IN} - V_{OFF})^5 \qquad (8)$$

Here, a coefficient B5 is determined by a gain of the fifth order component generating circuit and the gain of the variable gain amplifying circuit.

Next, operation of the fifth order component generating circuit will be described.

Figure 6:
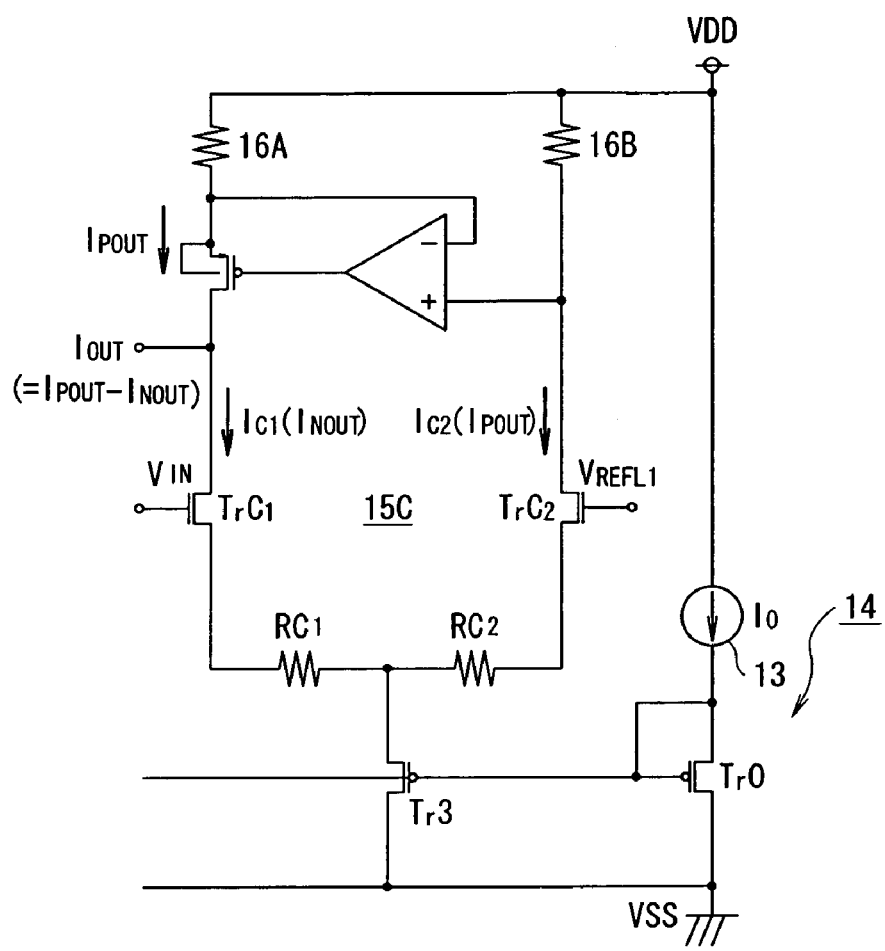
FIG. 6 is a basic circuit diagram for explaining operation of the fifth order component generating circuit in FIG. 5.

To begin with, a description will be given as to one differential amplifier 15C as shown in FIG. 6 in order to simplify the description of circuit operation of the fifth order component generating circuit. In a state in which an input voltage $V_{IN}$ is sufficiently smaller than the reference voltages $V_{REFL1}$, all the currents passing through the MOS field-effect transistors Tr3 will pass through the MOS field-effect transistors $TrC_2$.

Figure 7A:
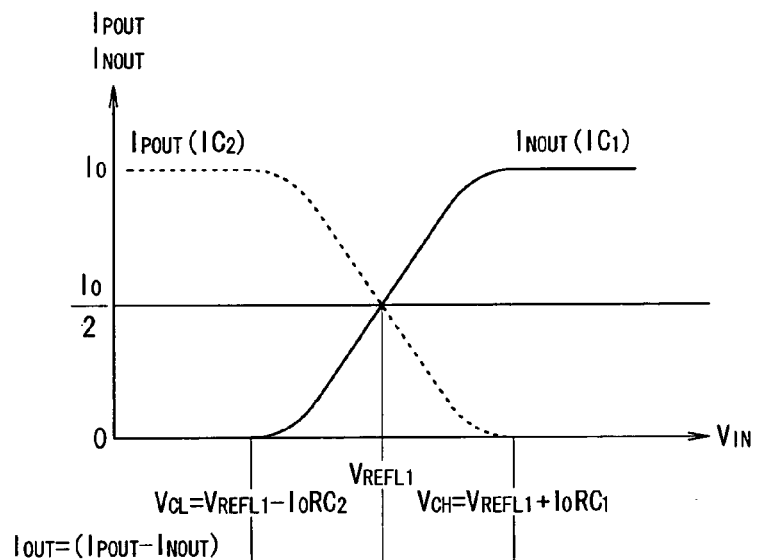
FIGS. 7A and 7B are characteristic diagrams showing output characteristics of each differential pair for explaining the operation of a portion of the fifth order component generating circuit in FIG. 5.

For this reason, if a constant current value of the current mirror circuit 14 is $I_0$, it follows that a current passing through the MOS field-effect transistor $TrC_2$ $I_{C2}=I_0$ and a current passing through the MOS field-effect transistor $TrC_1$ $I_{C1}=0$. Therefore, the current $I_{NOUT}$ and current $I_{POUT}$ become $I_0$ and 0 as shown in broken line and in full line in FIG. 7A.

From this state, if the input voltage $V_{IN}$ increases and exceeds $V_{CL}$ which is the constant level reference voltage $V_{REFL1}$ minus $I_0 \cdot RC_2$ for a voltage drop at a resistance $RC_2$, an output current $IC_2$ gradually and smoothly decreases. As opposed to it, an output current $IC_1$ smoothly increases, and if the input voltage $V_{IN}$ becomes equal to the constant level reference voltage $V_{REFL1}$, both the output currents $IC_1$ and $IC_2$ become equal. If the input voltage $V_{IN}$ further rises, the output current $IC_2$ maintains a decreasing trend and the output current $IC_1$ maintains an increasing trend. And if it becomes equal to or exceeds $V_{CH}$ which is the reference voltage $V_{REFL1}$ plus $I_0 \cdot RC_1$ for the voltage drop at a resistance $RC_1$, the output current $IC_2$ becomes 0 and the output currents $IC_1$ becomes $I_0$ inversely.

Figure 7B:
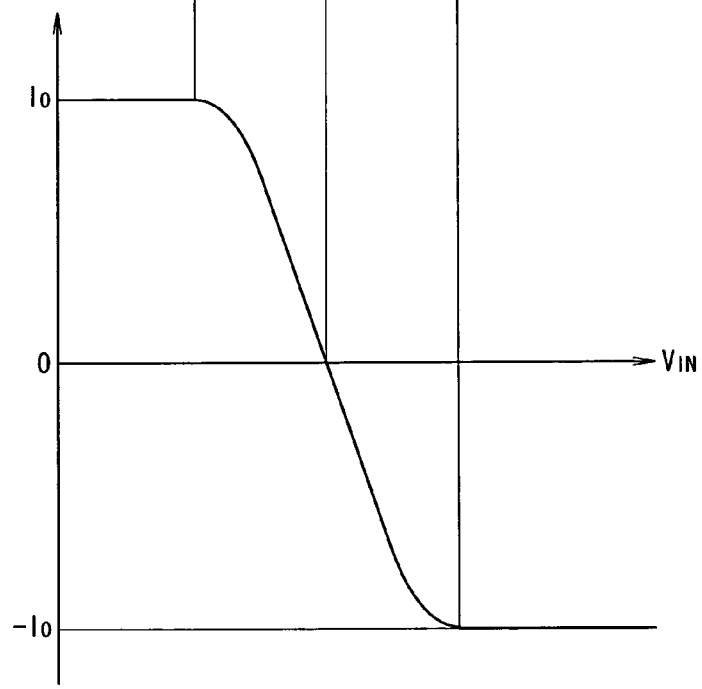

After all, of output characteristics in FIG. 7B, there is only a smooth change in the output near $V_{REFL1} \pm I_0 \cdot RC$ as to the characteristic of the transistors determined only by the resistance values RC of the resistances $RC_1$ and $RC_2$ and constant current value $I_0$ of the current mirror circuit 14.

Next, to simplify the description of the operation of the fifth order component generating circuit in FIG. 5, consideration is given to the circuits excluding the differential amplifiers 15A, 15E and 15F. When the input voltage $V_{IN}$ is sufficiently smaller than the constant level reference voltage $V_{REFL1}$ ($V_{IN} << V_{REFL1}$), all the currents passing through the MOS field-effect transistors Tr3 will pass through the MOS field-effect transistors $TrC_2$ in the differential amplifier 15C as previously mentioned so as to consequently become $I_{C2}=I_0$ and $I_{C1}=0$. Likewise, in the differential amplifiers 15B and 15D, it becomes $I_{B2}=I_{D2}=I_0$, $I_{B1}=I_{D1}=0$ and added currents $I_{POUT}=2\,I_0$ and $I_{NOUT}=I_0$.

And if the input voltage $V_{IN}$ increases, the current starts passing through the MOS field-effect transistor $TrC_1$ and the current passing through the MOS field-effect transistor $TrC_2$ starts decreasing accordingly. If the input voltage $V_{IN}$ reaches the constant level reference voltage $V_{REFL1}$, it becomes $I_{C1}=I_{C2}=I_0/2$. As the state does not change as to the other differential amplifiers 15B and 15D, the output currents $I_{NOUT}$ and $I_{POUT}$ consequently become $I_{NOUT}=I_{POUT}=3\,I_0/2$. If the input voltage $V_{IN}$ further rises, it becomes $I_{C2}=0$ and $I_{C1}=I_0$ so that the output currents $I_{POUT}$ and $I_{NOUT}$ consequently become $I_{POUT}=I_0$ and $I_{NOUT}=2\,I_0$.

If the input voltage $V_{IN}$ further increases, the current starts passing through the MOS field-effect transistor $TrB_1$ of the differential amplifier 15B and the current passing through the MOS field-effect transistor $TrB_2$ starts decreasing. If the input voltage $V_{IN}$ reaches the constant level reference voltage $V_{REFM}$, it becomes $I_{B1}=I_{B2}=I_0/2$. And the output currents $I_{POUT}$ and $I_{NOUT}$ become $I_{NOUT}=I_{POUT}=3\,I_0/2$ again.

If the input voltage $V_{IN}$ further increases after becoming $I_{POUT}=2\,I_0$ and $I_{NOUT}=I_0$, the current starts passing through the MOS field-effect transistor $TrD_1$ of the differential amplifier 15D and the current passing through the MOS field-effect transistor $TrD_2$ starts decreasing. If the input voltage $V_{IN}$ reaches the constant level reference voltage $V_{REFH1}$, the output currents $I_{POUT}$ and $I_{NOUT}$ become $I_{POUT}=I_{NOUT}=3\,I_0/2$ again. And if the input voltage $V_{IN}$ further increases, they become $I_{POUT}=I_0$ and $I_{NOUT}=2\,I_0$.

Figure 8:
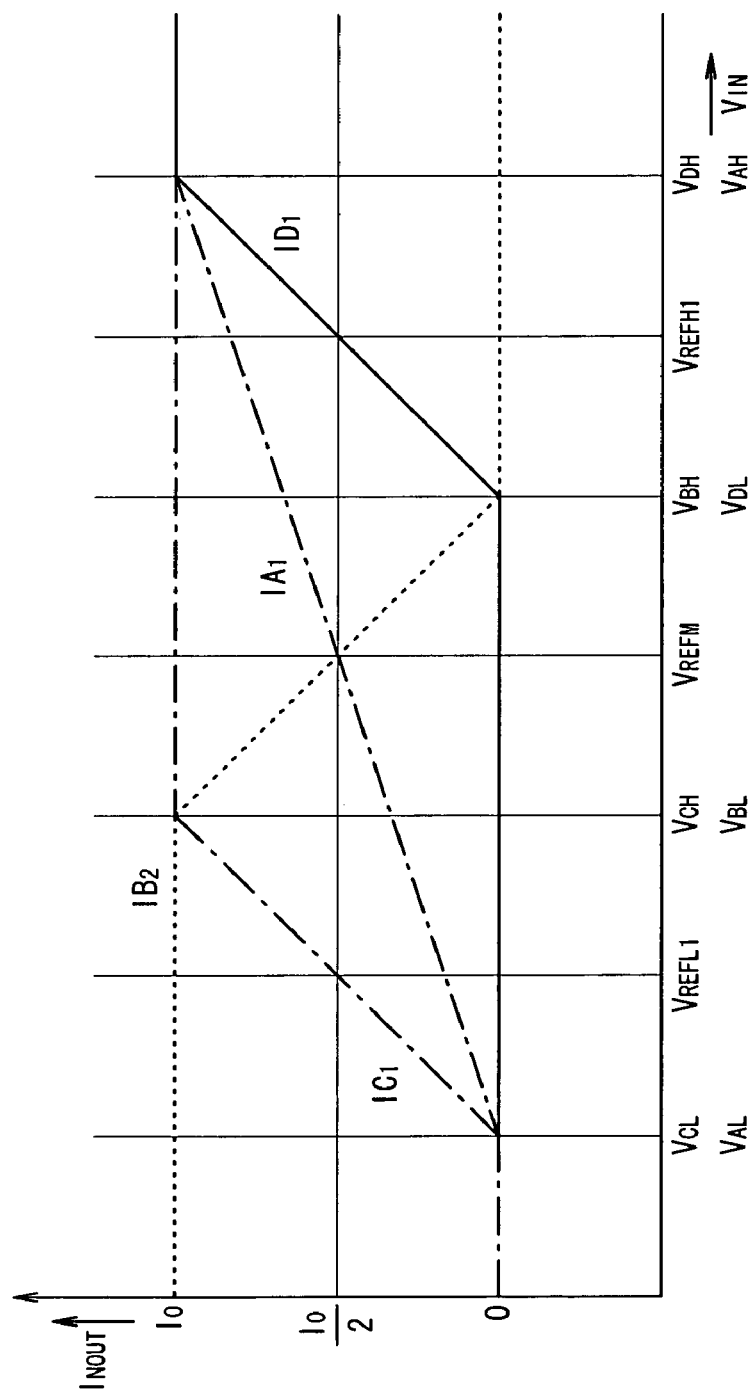
FIG. 8 is an output waveform diagram of FIG. 5.

Therefore, viewing the $I_{NOUT}$ side for instance, the output current $I_{C1}$ of the third differential amplifier 15C maintains 0 until the voltage of an input signal $V_{IN}$ reaches a minimum value $V_{CL}$ of the third differential amplifier 15C, starts increasing on exceeding the minimum value $V_{CL}$, becomes $I_0/2$ on reaching the constant level reference voltage $V_{REFL1}$, and also increases thereafter according to increase in the voltage of an input signal $V_{IN}$ so as to reach $I_0$ at a maximum value $V_{CH}$ and become saturated as shown in dashed line in FIG. 8.

The output current $I_{B2}$ of the second differential amplifier 15B maintains $I_0$ until the voltage of the input signal $V_{IN}$ reaches a minimum value $V_{BL}$ (set as an equal value to $V_{CH}$ according to this embodiment) of the second differential amplifier 15B, starts decreasing on exceeding the minimum value $V_{BL}$, becomes $I_0/2$ on reaching the constant level reference voltage $V_{REFM}$, and also decreases thereafter according to increase in the voltage of the input signal $V_{IN}$ so as to maintain 0 at a maximum value $V_{BH}$ or more as shown in broken line in FIG. 8.

Furthermore, the output current $I_{D1}$ of the fifth differential amplifier 15D maintains 0 until the voltage of the input signal $V_{IN}$ reaches a minimum value $V_{DL}$ (set as an equal value to $V_{BH}$ according to this embodiment) of the fourth differential amplifier 15D, starts increasing on exceeding the minimum value $V_{DL}$, becomes $I_0/2$ on reaching the constant level reference voltage $V_{REFH1}$, and also decreases thereafter according to increase in the voltage of the input signal $V_{IN}$ so as to reach $I_0$ and become saturated at a maximum value $V_{DH}$ as shown in full line in FIG. 8.

As the first differential amplifier 15A is not added at this point in time, a linear function of a negative inclination is added to an odd function.

Therefore, it is the same configuration as the differential amplifiers 15C and 15D, where the linear function can be offset by adding the output current of the first differential amplifier 15A of which range of a minimum value $V_{AL}$ and a maximum value $V_{AH}$ is widely set.

To be more specific, it is possible, by adjusting energization currents supplied to the differential amplifier 15A and resistances $RA_1$ and $RA_2$ and optimizing the area and inclination of a linear function area, to match the minimum value $V_{AL}$ with $V_{CL}$ of the third differential amplifier 15D and also match the maximum value $V_{AH}$ with the maximum value $V_{CH}$ of the fourth differential amplifier 15D regarding input-output characteristics as shown in chain double-dashed line in FIG. 8 so as to obtain the output current having no linear component.

Furthermore, the differential amplifier 15E of the same configuration as the differential amplifier 15C is added. It is added for the sake of accurately implementing the characteristic of the fifth order function, because the fifth order function is characterized by, in the area of the inputs voltage $V_{IN}$ very remote from the constant level reference voltage $V_{REFM}$, being the output having a significant inclination against $V_{IN}$.

To be more specific, it is possible, by setting the inputted constant level reference voltage $V_{REFL2}$ at a value smaller than $V_{REFL1}$ inputted to the differential amplifier 15C, to increase the energization current value and increase the resistance value so as to pass the output current of a more precipitous inclination to the input voltage $V_{IN}$ in the range in which the input voltage $V_{IN}$ is smaller than the minimum value $V_{CL}$. Likewise, it is possible, by setting the constant level reference voltage $V_{REFH2}$ inputted to the differential amplifier 15F of the same configuration as the differential amplifier 15D at a value larger than $V_{REFH1}$ inputted to the differential amplifier 15D, to increase the energization current value and increase the resistance value so as to pass the output current of a more precipitous inclination to the input voltage $V_{IN}$ in the range in which the input voltage $V_{IN}$ is larger than the maximum value $V_{DH}$.

Figure 9A:
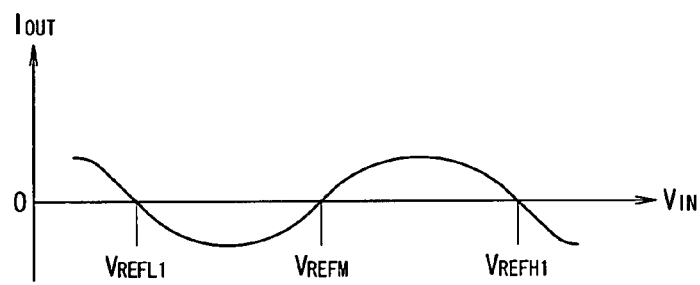
FIGS. 9A to 9D are output waveform diagrams for explaining the operation of the fifth order component generating circuit in FIG. 5.
Figure 9B:
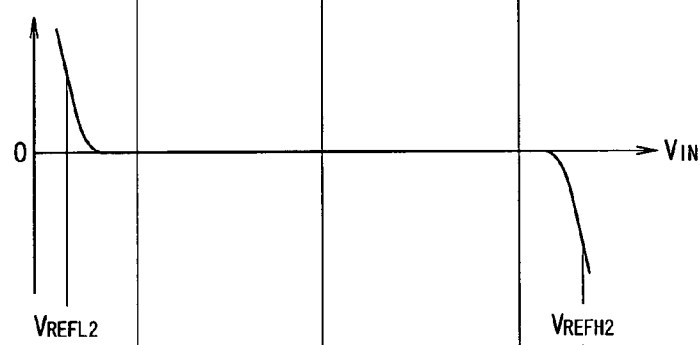
Figure 9C:
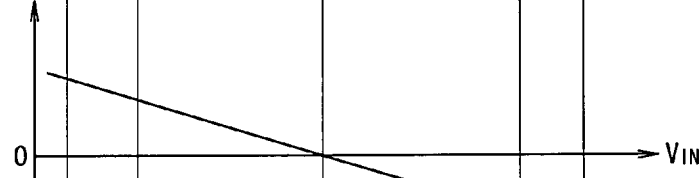
Figure 9D:
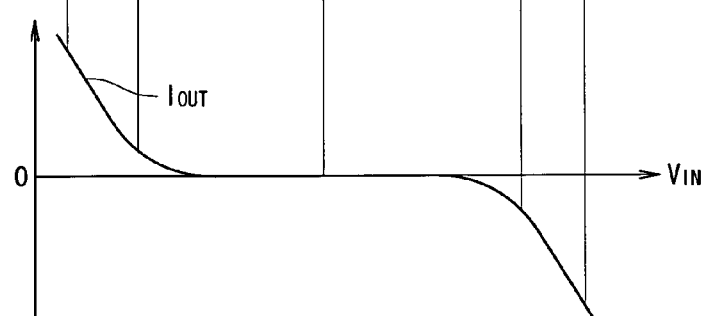

As described above, as for the output currents $I_{OUT}$ of the fifth order component generating circuit, the output of the differential amplifier 15A is as shown in FIG. 9C, output addition of the differential amplifiers 15B, 15C and 15D is as shown in FIG. 9A, and the output addition of the differential amplifiers 15E and 15F is as shown in FIG. 9B. If the entirety is added, it becomes a smooth fifth order function current output $I_{OUT}$ as shown in FIG. 9D. Therefore, as shown in FIG. 4, if the constant voltage is supplied to the normal rotation input side and the fifth order function current output $I_{OUT}$ is supplied to the inverting input side of the operational amplifier OPA having the variable resistance VR inserted via the negative feedback constituting the variable gain amplifying circuit 11, it is possible to obtain the output $V5_{OUT}$ of only the fifth order component including no linear component inverted from the operational amplifier OPA.

Thus, it is possible, by using the six differential amplifiers as described above, to appropriately set circuit constants so as to generate only the fifth order function including no linear component as in formula (9) below.

$$V5_{OUT}=B5(V_{IN}-V_{REFM})^5 \qquad (9)$$

This circuit configuration is also applicable to the odd function of n-th order. Therefore, it is possible to appropriately set the values of the constant level reference voltages $V_{REFL2}$ and $V_{REFH2}$, resistance values $RE_1$, $RE_2$, $RF_1$ and $RF_2$ and the energization current value inputted to the differential amplifiers 15E and 15F and further add a plurality of differential amplifiers to optimize the resistance values, reference voltages and energization current value so as to obtain the output as in formula (10) below.

$$Vn_{OUT} = Bn(V_{IN} - V_{REFM})^n \quad (10)$$

To be more specific, it should comprise: a plurality i (i is an integer of 5 or more) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant level signal generating circuit for providing the constant level signal to each of the i differential amplifiers, wherein: first, second and third differential amplifiers of the i differential amplifiers are set to have the constant level signals at increasingly higher levels inputted in order; the output signals of the first and third differential amplifiers and those of the second differential amplifier are set to be of mutually reverse polarity; a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier; each of (i–4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i–4) differential amplifiers and those of the second differential amplifier are set to be of mutually reverse polarity, thus constituted to form the output signal of the component of a k-th order function (k is an odd number of 7 or more) on adding up the output signals of the first, second, third and (i–4) differential amplifiers; and the fourth differential amplifier is constituted to form the output signal of a linear component for offsetting the linear component of the n-th order function component so as to generate the component of the k-th order function including no linear component by adding the output signals of the i differential amplifiers.

Next, a fourth order component generating circuit will be described as an example of an even function output circuit.

Figure 10:
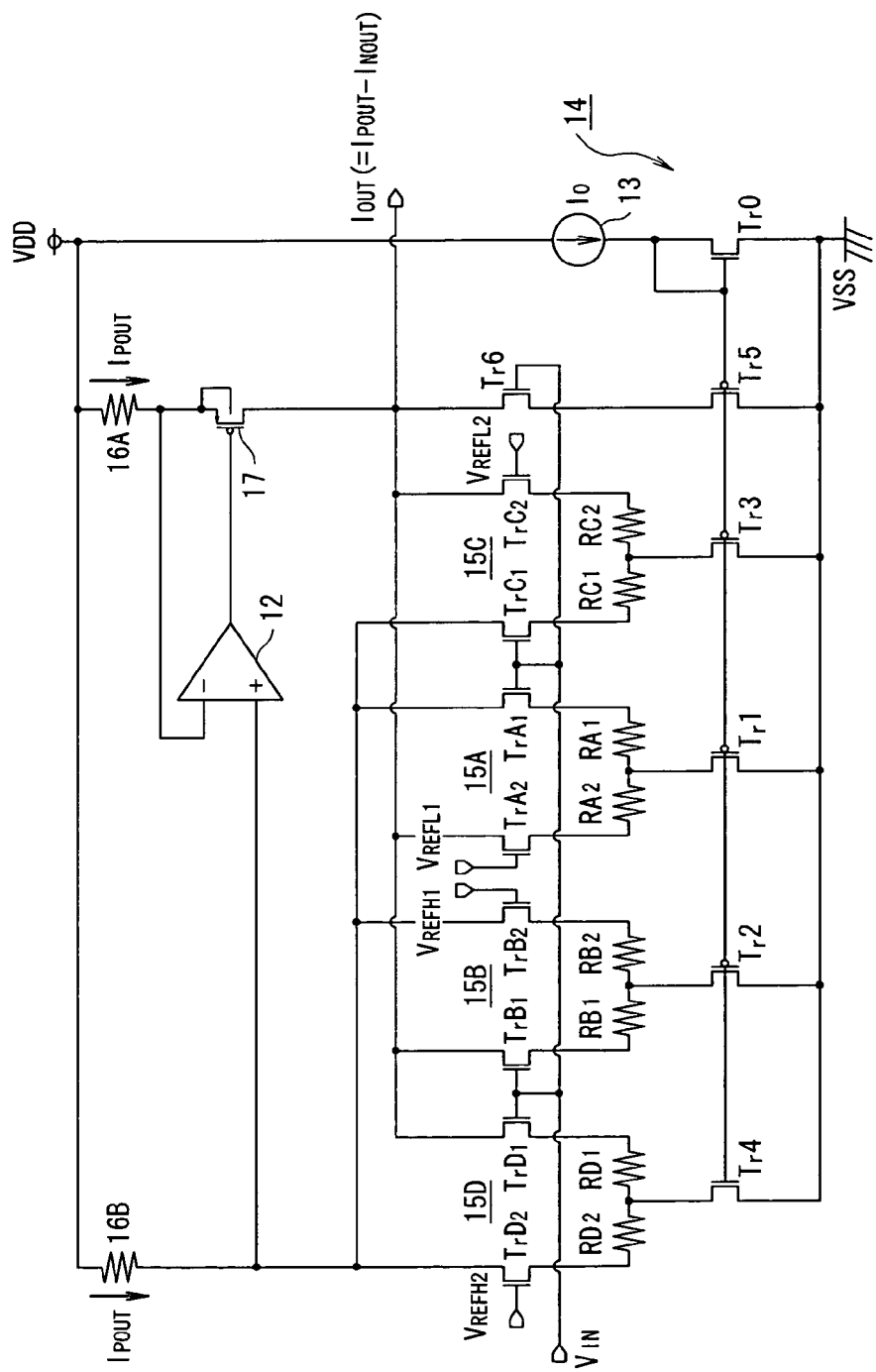
FIG. 10 is a circuit diagram showing an example of the fourth order component generating circuit applicable to FIG. 4.

FIG. 10 shows an example of the fourth order component generating circuit.

The fourth order component generating circuit is comprised of the current mirror circuit 14 comprising the MOS field-effect transistor Tr0 having the gate and drain connected from the positive power terminal VDD via the constant current source 13 and having the source grounded to the VSS and the five MOS field-effect transistors Tr1 to Tr5 having their respective gates connected to the gate of the MOS field-effect transistor Tr0, the MOS field-effect transistor Tr6 constituting a constant current source circuit to which the constant current is supplied from the current mirror circuit 14, and the resistances 16A and 16B having the same resistance value as the adder for adding the output currents of the differential amplifiers 15A to 15D and the constant current source circuit. The differential amplifiers 15A to 15D are supplied with different constant level reference voltages $V_{REFH1}$, $V_{REFH2}$, $V_{REFL2}$ and $V_{REFL1}$ generated by the constant level signal generating circuit 20.

Here, the differential amplifier 15A has MOS field-effect transistors $TrA_1$ and $TrA_2$ serially connected to the drain of the MOS field-effect transistor Tr1 of the current mirror circuit 14 via resistances $RA_1$ and $RA_2$ respectively. The input signal $V_{IN}$ is supplied to the gate of the transistor $TrA_1$, and the constant level reference voltages $V_{REFL1}$ is supplied to the gate of the transistor $TrA_2$. The drain of the transistor $TrA_1$ is connected to the positive power terminal VDD via one of the resistances 16B constituting the adder while the drain of the transistor $TrA_2$ is connected to the positive power terminal VDD via the MOS field-effect transistor 17 and the other resistance 16A constituting the adder.

And the differential amplifiers 15B, 15C and 15D have equal configurations in which the constant level reference voltages $V_{REFH1}$, $V_{REFL2}$ and $V_{REFH2}$ generated by the constant level signal generating circuit 20 are supplied to the respective gates of the transistors $TrB_2$, $TrC_2$ and $TrD_2$. However, the differential amplifiers 15B and 15D are set to have reverse characteristics to the differential amplifiers 15A and 15C.

The constant level reference voltages are $V_{REFH2} > V_{REFH1} > V_{REFL1} > V_{REFL2}$, and the values of the currents passing through the transistors TrC and TrD are set at larger values than TrA and TrB, such as $I_A = I_B = I_0$, $I_C = I_D = 2 I_0$ for instance.

Figure 11A:
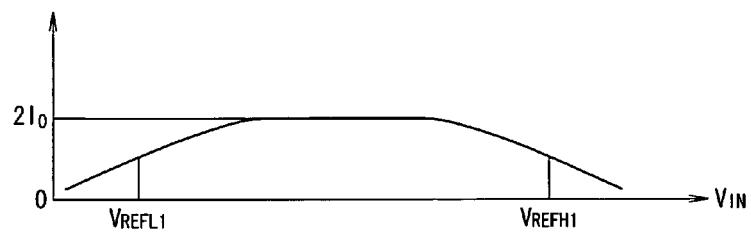
FIGS. 11A to 11D are output waveform diagrams for explaining the operation of the fourth order component generating circuit in FIG. 10.
Figure 11B:
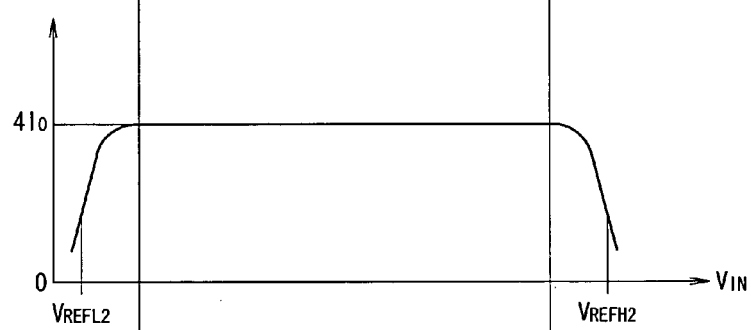

As behavior of a single differential amplifier is the same as that in the description as to the fifth order component generating circuit, the output $I_{OUT}$ by the differential amplifiers 15A and 15B is as shown in FIG. 11A. Furthermore, the output by the differential amplifiers 15C and 15D is as shown in FIG. 11B. These output currents are added and converted to voltages by the variable resistance VR provided in FIG. 4 so as to obtain the output of the fourth order function against the input signal $V_{IN}$.

When the input signal $V_{IN}$ is at the inflection point $x_0$ of the fourth order function, that is, between the constant level reference voltages $V_{REFL1}$ and $V_{REFH1}$, the output current $I_{OUT}$ becomes $I_{OUT} = I_{POUT} - I_{NOUT} = 2 I_0 + I_0 + I_0 + 2 I_0 = 6 I_0$ so that it becomes the 0-th order component of the output. Therefore, the circuit having 6 $I_0$ supplied thereto as the constant current is added in order to offset the 0-th order component. This can be created from the current mirror circuit 14 supplying the constant current to each of the differential amplifiers 15A to 15D. At this time, it is possible to connect the other resistance 16A constituting the adder to the MOS field-effect transistors Tr1 to Tr5 of the current mirror circuit 14 via another MOS field-effect transistor Tr6 inputting the input signal $V_{IN}$ to that gate so that a source-drain voltage of the MOS field-effect transistors Tr1 to Tr5 constituting the current mirror circuit 14 gets close to the source-drain voltage of the other MOS field-effect transistor Tr6 so as to obtain a more accurate output.

Figure 11C:
Figure 11D:
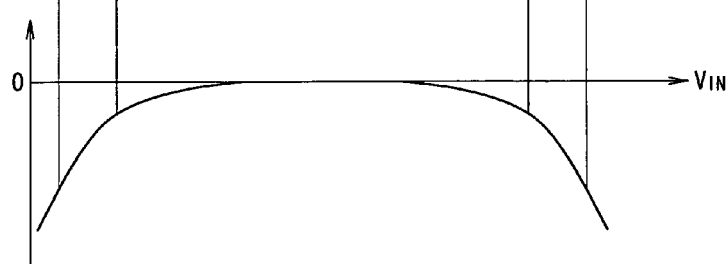

The output currents from the constant current circuit are as shown in FIG. 11C. If all the current outputs are added up, a fourth order function current output $I_{OUT}$ as in FIG. 11D can be obtained. It is possible to supply the constant voltage $V_{OFF}$ generated by the constant voltage generating circuit 10 to the normal rotation input side and also supply the current output $I_{OUT}$ to the inverting input side of the operational amplifier OPA having the variable resistance VR inserted via the negative feedback constituting the variable gain amplifying circuit 11 as shown in FIG. 4 so as to obtain an output $V4_{OUT}$ of only the fourth order component having inverted the current output from the operational amplifier OPA.

Thus, it is possible to appropriately set the circuit constants by using the four differential amplifiers 15A to 15D and the constant current circuit as described above so as to generate only the fourth order function including no 0-th order component as in formula (11) below.

$$V4_{OUT} = B4(V_{IN} - V_{REFM})^4 \quad (11)$$

This circuit configuration is also applicable to the even function of m-th order. And it is possible to appropriately set the values of the constant level reference voltages $V_{REFL1}$, $V_{REFL2}$, $V_{REFH1}$ and $V_{REFH2}$, resistances $RA_1$ to $RD_2$ and the energization current value inputted to the differential amplifiers 15A to 15D and further add a plurality of differential amplifiers to optimize the resistance values, constant level reference voltages and energization current value so as to obtain the output as in formula (12) below.

$$Vm_{OUT} = Bm(V_{IN} - V_{REFM})^m \quad (12)$$

To be more specific, it should comprise: a plurality j (j is an integer of 4 or more) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant signal outputting circuit for outputting a constant output signal; a constant level signal generating circuit for providing the constant level signal to each of the j differential amplifiers, wherein: first, second, third and fourth differential amplifiers of the j differential amplifiers are set to have the constant level signals at increasingly higher levels inputted in order; the output signals of the first and second differential amplifiers and those of the third and fourth differential amplifiers are set to be of mutually reverse polarity, thus constituted to form the output signal of the component of an m-th order function (m is an even number of 6 or more) on adding up the output signals of the j differential amplifiers; and the constant signal outputting circuit is constituted to form the output signal of a 0-th order component for offsetting the 0-th order component of the m-th order function component so as to generate the component of the m-th order function including no 0-th order component by adding the output signals of the j differential amplifiers and the constant signal outputting circuit.

Next, a description will be given as to an improvement example of a cubic component generating circuit in the case of extending the compensated temperature range to be either higher or lower. Extension of the temperature range is equivalent to expanding the range of the output voltage from the temperature detecting circuit 1, that is, expanding the range of the input voltage of the cubic component generating circuit.

Figure 12:
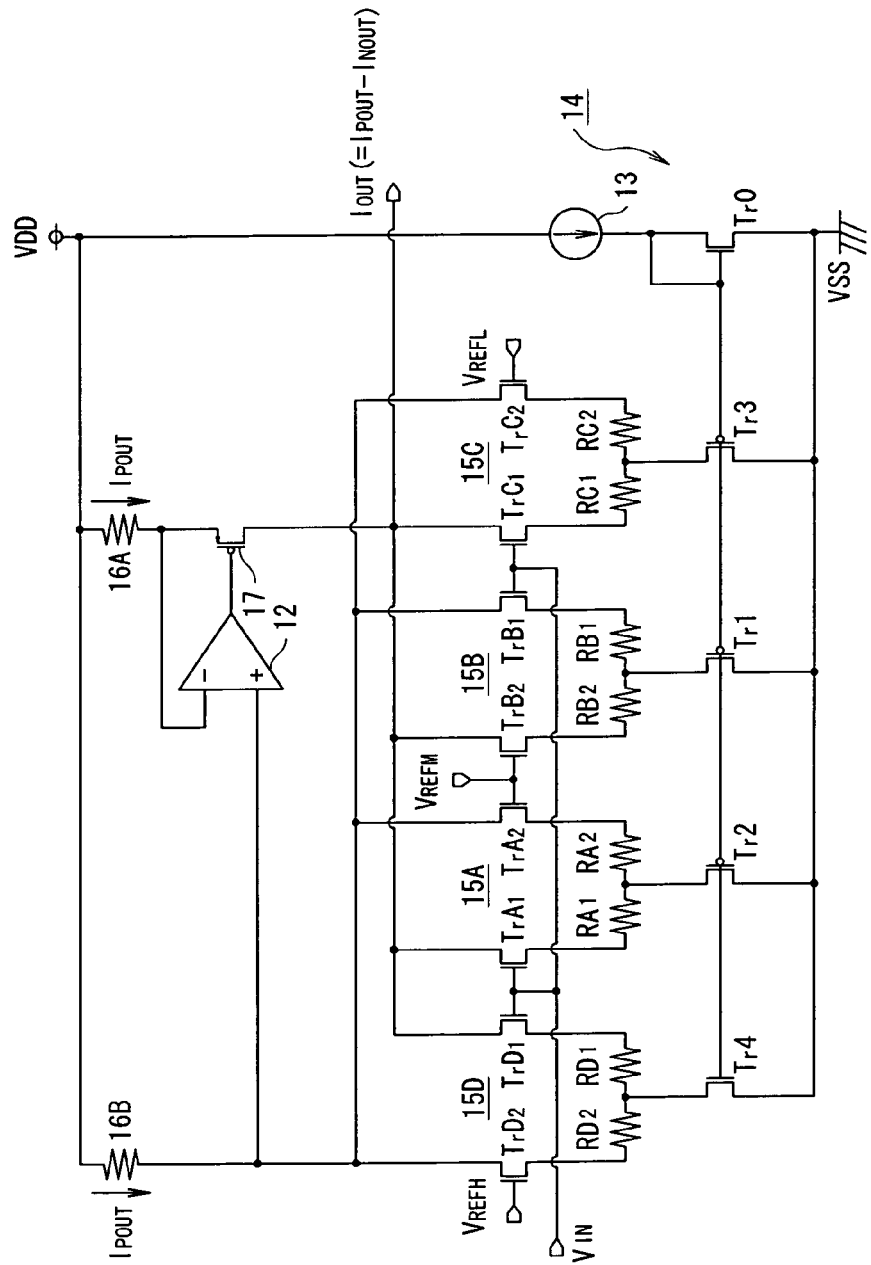
FIG. 12 is a circuit diagram showing a basic portion of a cubic component generating circuit applicable to FIG. 4.

As shown in FIG. 12, the cubic component generating circuit known so far is comprised of the current mirror circuit 14 comprising the MOS field-effect transistor Tr0 having a gate and a drain connected to a positive power terminal VDD via the constant current source 13 and having the source grounded to the VSS and four MOS field-effect transistors Tr1 to Tr4 having their respective gates connected to the gate of the MOS field-effect transistor Tr0, four differential amplifiers 15A to 15D constituting the first to fourth amplifiers to which the constant current is supplied from the current mirror circuit 14, and the resistances 16A and 16B having the same resistance value for constituting the adder for adding the output currents of the differential amplifiers 15A to 15D. The differential amplifiers 15A to 15D are supplied with different constant level reference voltages $V_{REFH}$, $V_{REFM}$ and $V_{REFL}$.

Here, the differential amplifier 15A has the MOS field-effect transistors $TrA_1$ and $TrA_2$ serially connected to the drain of the MOS field-effect transistor Tr1 of the current mirror circuit 14 via resistances $RA_1$ and $RA_2$ respectively. The input signal $V_{IN}$ is supplied to the gate of the transistor $TrA_1$, and the constant level reference voltages $V_{REFM}$ is supplied to the gate of the transistor $TrA_2$. The drain of the transistor $TrA_1$ is connected to the positive power terminal VDD via one of the resistances 16A constituting the adder and an MOS field-effect transistor 17 for receiving the output of the differential amplifier 12 on its gate while the drain of the transistor $TrA_2$ is connected to the positive power terminal VDD via the other resistance 16B constituting the adder.

Likewise, the differential amplifier 15B also has the MOS field-effect transistors $TrB_1$ and $TrB_2$ serially connected to the drain of the MOS field-effect transistor Tr1 of the current mirror circuit 14 via the resistances $RB_1$ and $RB_2$ respectively. The input signal $V_{IN}$ is supplied to the gate of the transistor $TrB_1$, and the constant level reference voltages $V_{REFM}$ is supplied to the gate of the transistor $TrB_2$. As is contrary to the aforementioned differential amplifier 15A, however, the drain of the transistor $TrB_1$ is connected to the positive power terminal VDD via the other resistance 16B constituting the adder while the drain of the transistor $TrB_2$ is connected to the positive power terminal VDD via the MOS field-effect transistor 17 and one of the resistances 16A constituting the adder so as to have reverse characteristics to the other differential amplifiers 15A, 15C and 15D.

The differential amplifiers 15C and 15D have equal configurations to that of the differential amplifier 15A, provided that the input signal $V_{IN}$ is supplied to the gates of the transistors $TrC_1$ and $TrD_1$ belonging to them respectively, and the constant level reference voltages $V_{REFL}$ and $V_{REFH}$ are supplied to the gates of the transistors $TrC_2$ and $TrD_2$.

Figure 13A:
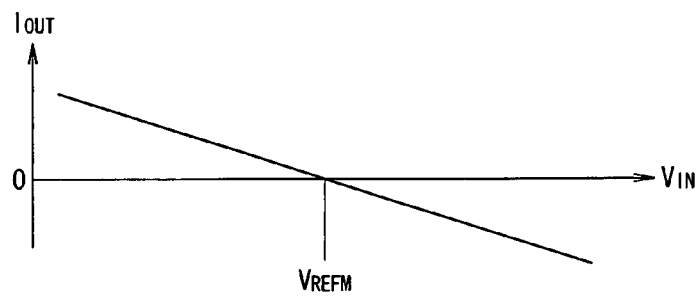
FIGS. 13A to 13E are output waveform diagrams for explaining the operation of the basic portion of the cubic component generating circuit in FIG. 12.
Figure 13B:
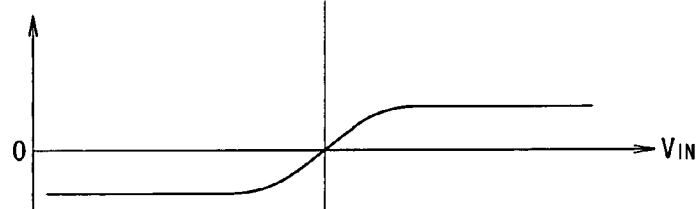
Figure 13C:
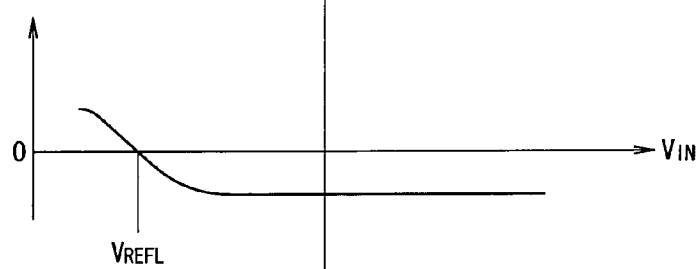
Figure 13D:
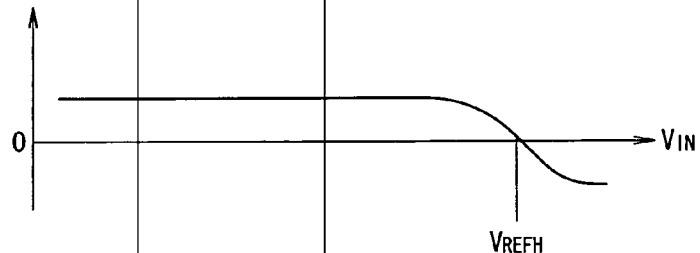
Figure 13E:
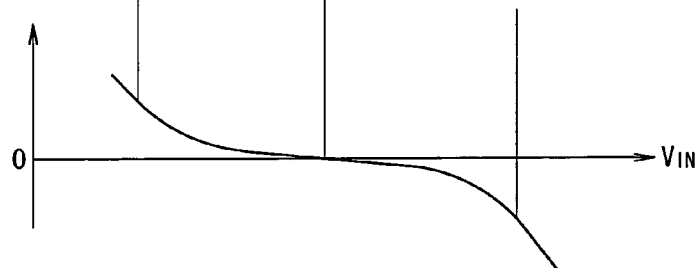

The output current $I_{OUT}$ of the differential amplifier 15A is as shown in FIG. 13A, the output current $I_{OUT}$ of the differential amplifier 15B is as shown in FIG. 13B, the output current $I_{OUT}$ of the differential amplifier 15C is as shown in FIG. 13C, and the output current $I_{OUT}$ of the differential amplifier 15D is as shown in FIG. 13D. As the entire output currents are the addition of the output currents $I_{OUT}$, the result is as shown in FIG. 13E. This output current is supplied to the inverting input side of the operational amplifier OPA having the variable resistance VR inserted via the negative feedback constituting the variable gain amplifying circuit 11, and the constant voltage is supplied to the normal rotation input side of the operational amplifier OPA so as to obtain the output $V3_{OUT}$ of only the cubic component including no linear component as represented by formula (13) below.

$$V3_{OUT} = B3(V_{IN} - V_{OFF})^3 \quad (13)$$

Here, a coefficient B3 is determined by the gain of the cubic component generating circuit and the gain of the variable gain amplifying circuit 11.

However, in the case of extending the range of input voltage only to be higher as to the cubic component generating circuit for instance, the input voltage $V_{IN}$ significantly deviates from the cubic component generating circuit at a place where it is high as shown in FIG. 13E. It is because the output of the differential amplifier 15D becomes saturated.

For this reason, it is necessary to correct the output of the differential amplifier 15D to which the constant level reference voltage $V_{REFH}$ is inputted.

Figure 14:
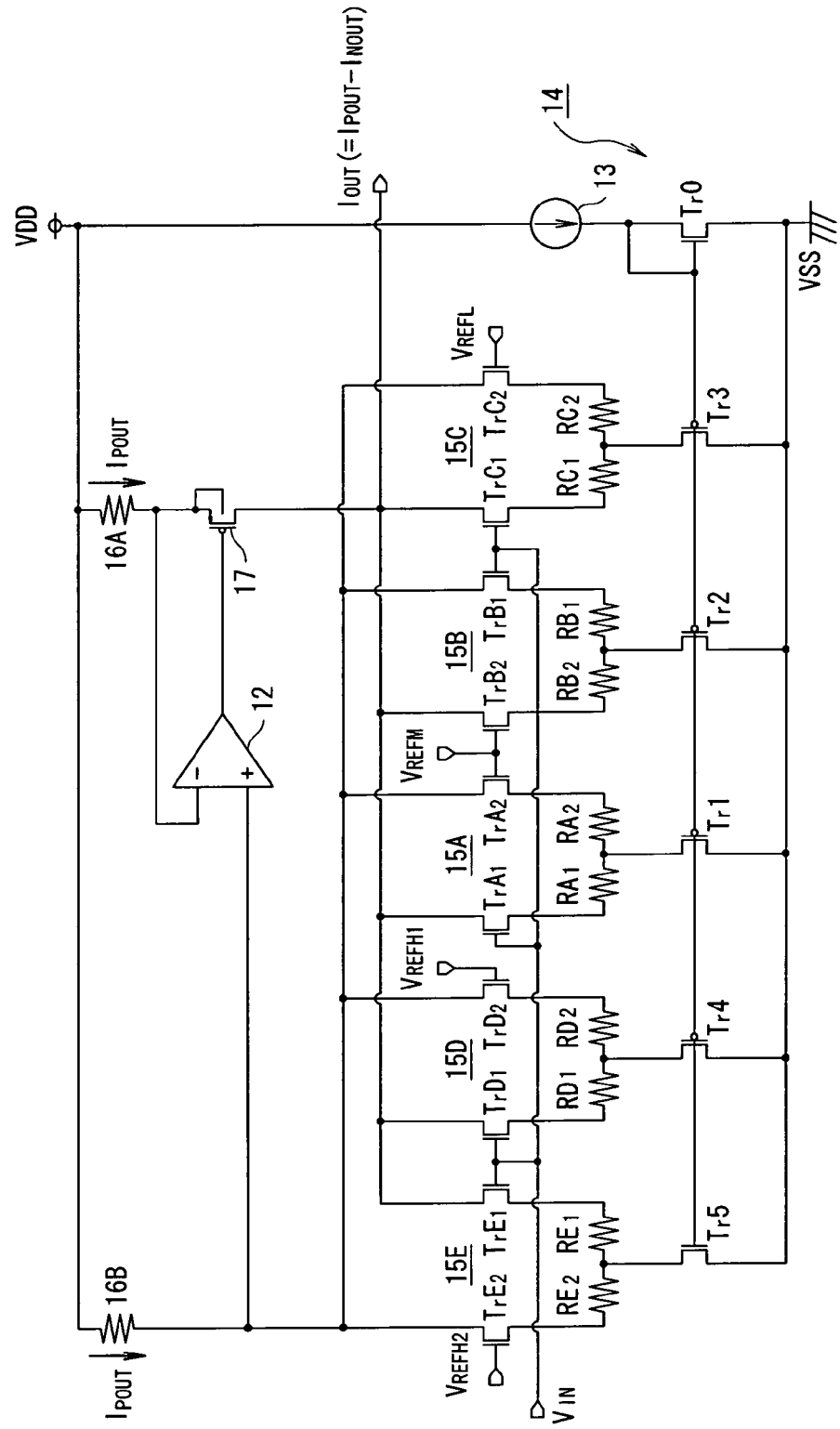
FIG. 14 is a circuit diagram showing an example of the cubic component generating circuit suitable in the case of expanding an input voltage range.

Here, the differential amplifier 15E for inputting the constant level reference voltage $V_{REFH2}$ is added. The improved cubic component generating circuit is shown in FIG. 14. However, it is set at the constant level reference voltage $V_{REFH2} > V_{REFH}$. It is possible to offset the 0-th order component by setting energization currents $I_{C0}$, $I_{D0}$ and $I_{E0}$ of the differential amplifiers 15C, 15D and 15E to be $I_{C0} = I_{D0} + I_{E0}$.

Figure 15A:
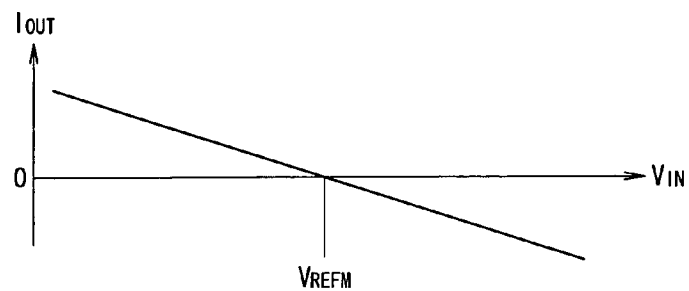
FIGS. 15A to 15E are output waveform diagrams for explaining the operation of the cubic component generating circuit in FIG. 14.
Figure 15B:
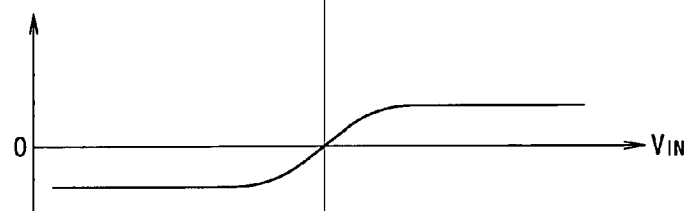
Figure 15C:
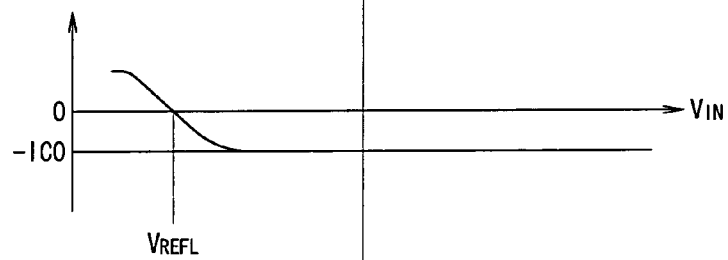
Figure 15D:
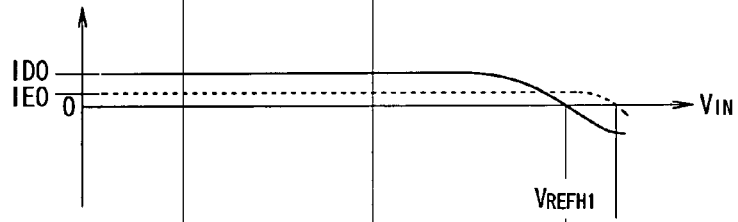
Figure 15E:
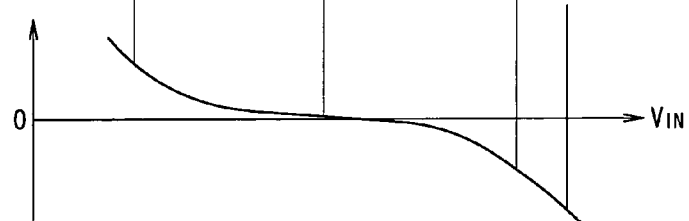

First, the differential amplifiers 15A, 15B and 15C have the same configuration so that their outputs will be as shown in FIGS. 15A, 15B and 15C respectively. And the output of the differential amplifier 15D is as indicated in full line in FIG. 15D while the output of the differential amplifier 15E is as shown in FIG. 15D. It is possible, by adding the output current of the differential amplifier 15E near the point where the output of the differential amplifier 15D becomes saturated, to make a correction to significant deviation of the input voltage $V_{IN}$ from the cubic component generating circuit at a place where it is high so that an output result of adding all will be as shown in FIG. 15E.

Thus, it is possible, by appropriately setting resistance values $RD_1$, $RD_2$, $RF_1$ and $RF_2$ and the constant level reference voltages $V_{REFH}$ and $V_{REFH2}$ of the respective amplifiers, to constitute the cubic component generating circuit for obtaining a better cubic function on extending the range of the input voltage $V_{IN}$ only to be higher.

Figure 16:
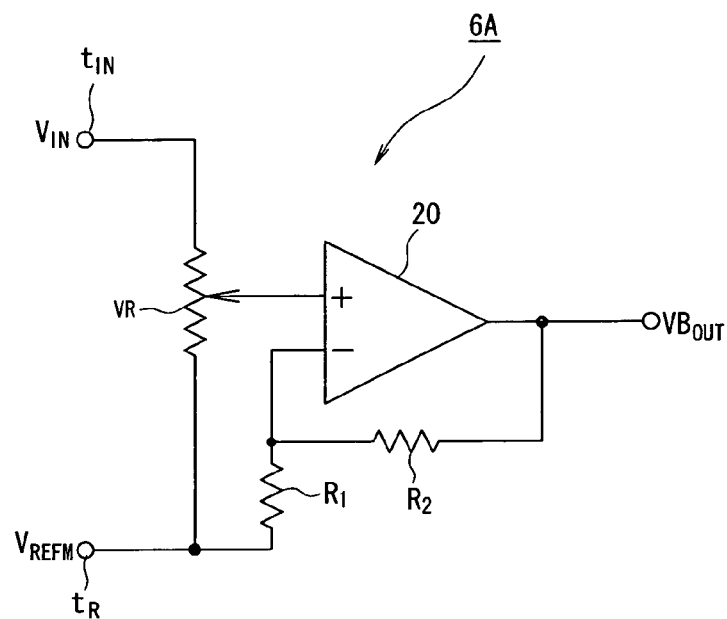
FIG. 16 is a block diagram showing a linear function generating portion applicable to FIGS. 1 to 3.

As shown in FIG. 16, the linear component generating portion 6A is comprised of the variable resistance VR connected between an input terminal $t_{IN}$ for having the input signal $V_{IN}$ inputted and a constant level reference voltage input terminal $t_R$ and a normal rotation amplifier for having a slider of the variable resistance VR supplied to the normal rotation input side, having the constant level reference voltage input terminal $t_R$ supplied to the inverting input side via the resistance $R_1$ respectively and having the output signals returned to the inverting input side via the resistance $R_2$, where the constant level reference voltage $V_{REFM}$ of the cubic component generating circuit is supplied to the reference voltage input terminal $t_R$.

According to the linear component generating portion 6A, the input signal $V_{IN}$ is amplified by a normal rotation amplifier 20, where an output voltage $VB_{OUT}$ of the normal rotation amplifier 20 can be represented by the following formula.

$$VB_{OUT} = B1(V_{IN} - V_{REFM}) \quad (14)$$

Here, a coefficient variable B1 is determined by a set value of the variable resistance VR and the gain of the normal rotation amplifier 20.

Figure 17:
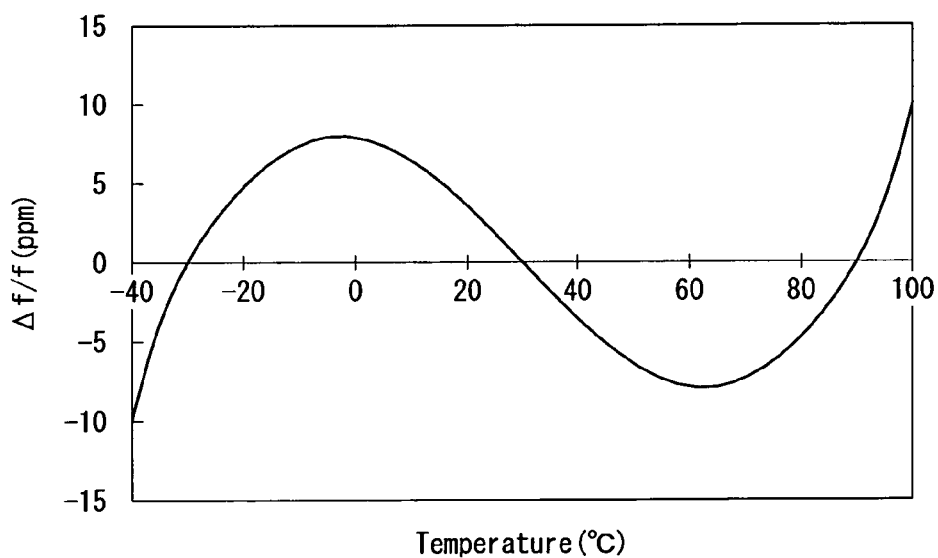
FIG. 17 is a diagram showing a frequency characteristic against a temperature of a crystal resonator.
Figure 18:
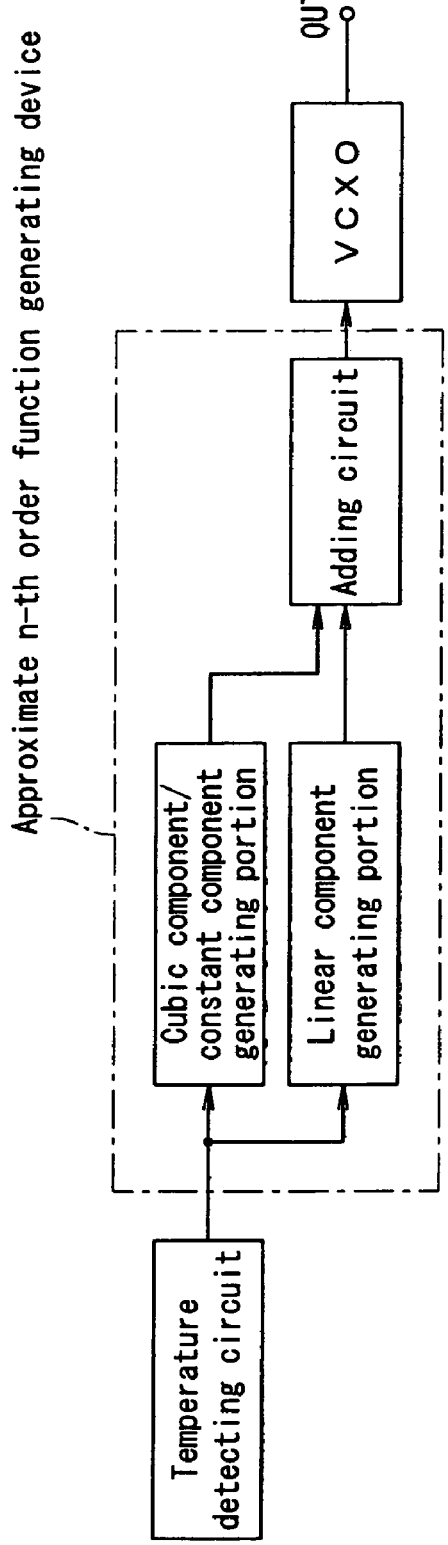
FIG. 18 is a block diagram showing a conventional example.
Figure 19:
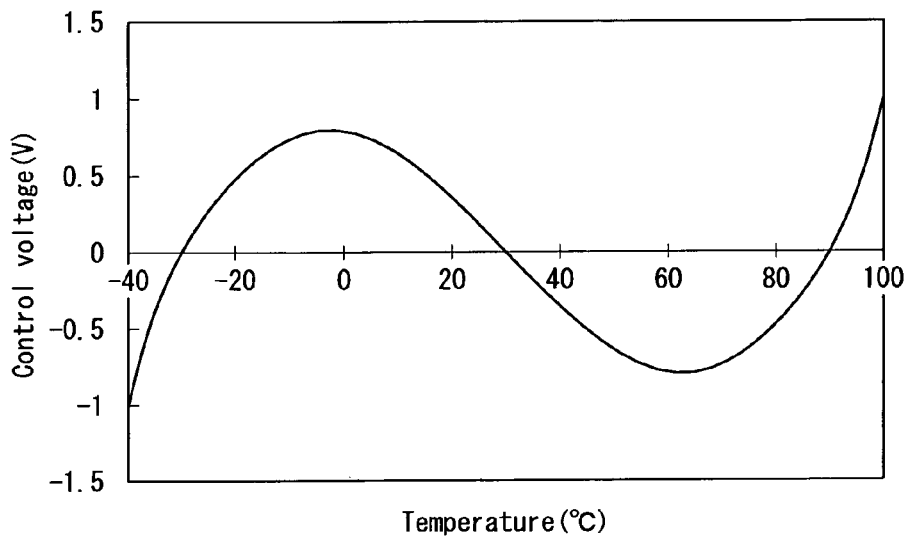
FIG. 19 is a diagram showing a temperature characteristic of control voltage to be inputted to a voltage-controlled crystal oscillator.
Figure 20:
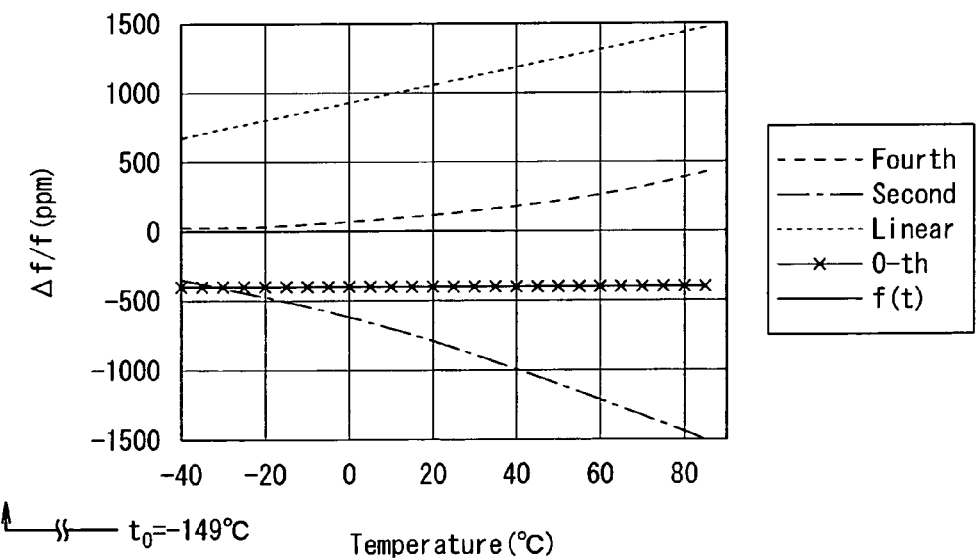
FIG. 20 is a characteristic diagram showing characteristics of a conventional approximate expression.

The aforementioned FIG. 1 represents an example of the temperature compensation crystal oscillation circuit of the present invention. A crystal resonator used therein has the temperature characteristic of an oscillating frequency against the temperature as shown in FIG. 17. This characteristic can be generally represented by a polynomial such as a formula (15) below.

$$Y = a_n(t-t_0)^n + a_{n-1}(t-t_0)^{n-1} + \ldots + a_3(t-t_0)^3 + a_1(t-t_0) + a_0 \quad (15)$$

This characteristic relies on the characteristics of the crystal resonator and voltage-controlled crystal oscillation circuit. A voltage-frequency characteristic of the voltage-controlled crystal oscillation circuit widely applied at present can be approximated by a linear function. Therefore, the frequency characteristic against the temperature of the crystal resonator can be implemented by a voltage characteristic against the temperature. Therefore, in the embodiment in FIG. 1, it is possible to generate the voltage equivalent to the terms on the right-hand side of formula (15) with the approximate n-th order function generating device 2 based on a temperature detection signal of the temperature detecting circuit 1, perform a gain adjustment as to individual variations among coefficients $a_0$ to $a_n$ of each order with the variable gain amplifying circuit 11 in each n-th order component generating portion, perform a fine adjustment, add the voltages after the fine adjustment with the adding circuit, and obtain the control voltage of the voltage-controlled crystal oscillation circuit corresponding to the frequency characteristic against the temperature of the crystal resonator so as to supply the control voltage to a voltage-controlled crystal oscillation circuit 3 and thereby correctly compensate for temperature dependence of the crystal resonator included therein.

To be more precise, the approximate n-th order function generating device 2 and a voltage-controlled crystal oscillator (VCXO) 3 in FIG. 1 are separately stored in a thermostatic oven of which temperature is then set at an arbitrary temperature $t_1$ within a range desired to perform temperature compensation. With the temperature of the thermostatic oven stably set at the preset temperature $t_1$, an input voltage $VC_{IN}$ of the voltage-controlled crystal oscillator 3 is changed to measure an input voltage $VC_{IN}(t_1)$ of which frequency of the output signal is the frequency matching a preset frequency and also measure an output voltage $VC_{OUTn}(t_1)$ of the approximate n-th order function generating device 2 as to each individual order. To be more specific, a strict measurement is performed by setting the gains of the other order components to be zero and rendering the output of only one component obtainable. Thus, n-th order to cubic data and linear and 0-th order data are taken as the output voltages of the approximate n-th order function generating device 2.

The above measurement process is repeated a plurality of times while sequentially changing the preset temperature of the thermostatic oven so as to measure the input voltages $VC_{IN}(t_1)$ to $VC_{IN}(t_m)$ of the voltage-controlled crystal oscillator 3 and also measure the output voltages $VC_{OUT1}(t_1)$ to $VC_{OUTm}(t_m)$ of the approximate n-th order function generating device 2 at the preset temperatures ($t_1$ to $t_m$).

Next, the output voltages $VC_{OUTn}(t_1)$ to $VC_{OUTn}(t_m)$ of the approximate n-th order function generating device 2 minus the respective 0-th order components $VC_{OUTn}(t_1)$ to $VC_{OUTn}(t_m)$ are approximated to a function of the temperature as in formula (16) below. This is because, as the output voltage $VC_{OUTn}$ of the approximate n-th order function generating device 2 includes the 0-th order component $VC_{OUTn}$ generated by the 0-th order component generating portion, the 0-th order component (offset) should be subtracted to obtain a more correct n-th order component $VC_{OUTn}$ and allow a more accurate adjustment. In this case, there is no limit to the approximated function and it may be arbitrarily determined according to the data. The data on the orders is individually taken so as to increase information for the adjustment and allow highly accurate adjustment.

$$VC_{OUTn}'(t) = VC_{OUTn}(t) - VC_{OUT0}(t) \quad (16)$$

Thereafter, the temperature compensation is performed by adjusting the coefficients $a_n$ to $a_0$ and $\Delta t$ so that a function $VC_{OUT}(t)$ shown in formula (17) below matches the measured input voltages $VC_{IN}(t_1)$ to $VC_{IN}(t_m)$ at each of the temperatures.

$$VC_{OUT}(t) = \alpha_n VC'_{OUTn}(t + \Delta t) + \ldots + \alpha_3 VC'_{OUT3}(t + \Delta t) + \alpha_1 VC'_{OUT1}(t + \Delta t) + VC'_{OUT0}(t + \Delta t) + \alpha_0 \quad (17)$$

To be more precise, a gain adjustment to obtain the coefficient $a_n$ is performed by the variable gain amplifying circuit 11 provided to the n-th order component generating portion, and the 0-th order component is adjusted by adding a constant voltage value for obtaining the coefficient $a_0$ at the adding circuit. The correction value $\Delta t$ is adjusted by adjusting the offset of the temperature detecting circuit 1.

It is possible to measure the input voltage $VC_{IN}$ of the voltage-controlled crystal oscillator 3 and temperature compensation circuit output voltages, that is, the output voltages $VC_{OUTn}$ to $VC_{OUT0}$ of each order of the approximate n-th order function generating device 2 respectively and adjust the approximate n-th order function generating device 2 based on these measurement results so as to perform highly accurate temperature compensation by performing temperature sweep work just once.

As is understandable from the above, it is easy, by using a description such as the aforementioned formula (5), to implement the approximate n-th order function generating device for generating the output voltage of that function. And it is also easy to adjust the above configuration in the case of using it as a temperature compensation circuit of the crystal oscillator for instance. It is also possible, as to both the odd functions and even functions, to design the respective order component generating devices of the above configuration with high accuracy. And it is possible, by using the above adjustment method, to adjust not only the approximate cubic function generating devices known so far but also the approximate n-th order function generating device 2 in $n \geq 4$ with higher accuracy.

Likewise, it is also possible to perform the same adjustment method as above to the temperature compensation crystal oscillation circuit to which the approximate fifth order function generating device 2A shown in FIG. 2 is applied so as to perform highly accurate temperature compensation to the temperature compensation crystal oscillation circuit specialized in the approximate fifth order function.

Furthermore, it is possible to perform the same adjustment method as above to the temperature compensation crystal oscillation circuit to which the approximate fourth order function generating device 2B shown in FIG. 3 is applied so as to perform the highly accurate temperature compensation to the temperature compensation crystal oscillation circuit specialized in the approximate fourth order function.

The embodiments were described as to the cases of using the MOS field-effect transistors on the approximate n-th order function generating circuits. However, they are not limited thereto but it is also possible to apply another active element such as a bipolar transistor.

The embodiments were described as to the cases of a ground standard. However, they are not limited thereto but it is also possible to adopt a VDD standard.

Furthermore, the embodiments were described as to the cases where the output from each order component generating device is the current output. However, they are not limited thereto but it is also possible, as a matter of course, to adopt a voltage output.

INDUSTRIAL APPLICABILITY

It is possible to generate the n-th order function with high accuracy by adopting the n-th order function generating device and perform the temperature compensation with high accuracy by applying the n-th order function generating device to the temperature compensation crystal oscillation circuit.

It becomes possible to perform the temperature compensation with high accuracy by adopting the temperature compensation adjustment method. In addition, it is possible to obtain detailed and correct data by measuring the orders individually. And it is possible to calculate more optimal coefficients based on actual data by considering errors other than those of the components of the orders. Furthermore, it is feasible to accurately adjust the temperature compensation by one temperature sweep not only in the approximate cubic function generating portion known so far but also in the approximate n-th function generating portion in $n \geq 4$.

The invention claimed is:

1. A k-th order component generating circuit, comprising:
a plurality i (i is an integer of 5 or more) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and
a constant level signal generating circuit for providing the constant level signal to each of the i differential amplifiers, wherein:
first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;
a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;
each of (i−4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i−4) differential amplifiers and those of the second differential amplifier are set to be of mutually reverse polarity; and
thus constituted to form the output signal of the component of a k-th order function (k is an odd number of 3 or more) on adding up the output signals of the first, second, third and (i−4) differential amplifiers; and the fourth differential amplifier is constituted to form the output signal of a linear component for offsetting the linear component of the k-th order function component so as to generate the component of the k-th order function including no linear component by adding the output signals of the i differential amplifiers.

2. The k-th order component generating circuit according to claim 1, wherein the circuit is a cubic order generating circuit set as i=5 and k=3.

3. The k-th order component generating circuit according to claim 2, wherein a fifth differential amplifier has the constant level signal to be inputted set to be lower than the level of the constant level signal to be inputted to the first differential amplifier and also has the range of the input signal to be the maximum value and the input signal to be the minimum value set smaller than that of the first differential amplifier.

4. The k-th order component generating circuit according to claim 2, wherein a fifth differential amplifier has the constant level signal to be inputted set to be higher than the level of the constant level signal to be inputted to the third differential amplifier and also has the range of the input signal to be the maximum value and the input signal to be the minimum value set smaller than that of the third differential amplifier.

5. The k-th order component generating circuit according to claim 1, wherein the circuit is a fifth order component generating circuit set as i=6 and k=5.

6. The k-th order component generating circuit according to claim 5, wherein a fifth differential amplifier has the constant level signal to be inputted set to be lower than the level of the constant level signal to be inputted to the first differential amplifier and also has the range of the input signal to be the maximum value and the input signal to be the minimum value set smaller than that of the first differential amplifier, and the sixth differential amplifier has the constant level signal to be inputted set to be higher than the level of the constant level signal to be inputted to the third differential amplifier and also has the range of the input signal to be the maximum value and the input signal to be the minimum value set smaller than that of the third differential amplifier.

7. An m-th order component generating circuit, comprising:
a plurality j (j is an integer of 4 or more) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and
a constant signal outputting circuit for outputting a constant output signal;
a constant level signal generating circuit for providing the constant level signal to each of the j differential amplifiers, wherein:
first, second, third and fourth differential amplifiers of the j differential amplifiers are set to have the constant level signals at increasingly higher levels inputted in order;
the output signals of the first and second differential amplifiers and those of the third and fourth differential amplifiers are set to be of mutually reverse polarity; and
thus constituted to form the output signal of the component of an m-th order function (m is an even number of 4 or more) on adding up the output signals of the j differential amplifiers; and the constant signal outputting circuit is constituted to form the output signal of a 0-th order component for offsetting the 0-th order component of the m-th order function component so as to generate the component of the m-th order function including no 0-th order component by adding the output signals of the j differential amplifiers and the constant signal outputting circuit.

8. The m-th order component generating circuit according to claim 7, wherein j is an even number of 6 or more, and each of (j−4) differential amplifiers other than the first, second, third and fourth differential amplifiers of the j differential amplifiers has the constant level signal to be inputted set to be either lower than a level of the constant level signal to be inputted to the first differential amplifier or higher than a level of the constant level signal to be inputted to the fourth differential amplifier.

9. The m-th order component generating circuit according to claim 7, wherein the circuit is a fourth order component generating circuit set as j=4 and m=4.

10. An approximate n-th order function generating device, comprising:
a 0-th order component generating portion for having a constant signal inputted and generating a constant component;
a linear component generating portion for having a linear input signal inputted and generating a linear component;
at least one k-th order component generating portion having a k-th order component (k is an odd number of 3 or more) generating circuit for having the linear input signal inputted and a first variable gain amplifying circuit for having an output signal of the k-th order component generating circuit inputted;
at least one m-th order component generating portion having an m-th order component (m is an even number of 4 or more) generating circuit for having the linear input signal inputted and a second variable gain amplifying circuit for having an output signal of the m-th order component generating circuit inputted; and
an adding circuit for adding the output signals of the 0-th order component generating portion, the linear component generating portion, the k-th order component generating portion and the m-th order component generating portion, wherein an approximate n-th order function (n is an integer of 4 or more) is generated.

11. An approximate n-th order function generating device, comprising:
a 0-th order component generating portion for having a constant signal inputted and generating a constant component;
a linear component generating portion for having a linear input signal inputted and generating a linear component;
at least one k-th order component generating portion having a k-th order component (k is an odd number of 3 or more) generating circuit comprising:
a plurality i (i is an integer of 5 or more) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant level signal generating circuit for providing the constant level signal to each of the i differential amplifiers, wherein:

first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;

a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;

each of (i–4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i–4) differential amplifiers and those of the second differential amplifier are set to be of mutually reverse polarity; and thus constituted to form the output signal of the component of a k-th order function (k is an odd number of 3 or more) on adding up the output signals of the first, second, third and (i–4) differential amplifiers; and the fourth differential amplifier is constituted to form the output signal of a linear component for offsetting the linear component of the k-th order function component so as to generate the component of the k-th order function including no linear component by adding the output signals of the i differential amplifiers for having the linear input signal inputted and a first variable gain amplifying circuit for having an output signal of the k-th order component generating circuit inputted;

at least one m-th order component generating portion having an m-th order component (m is an even number of 4 or more) generating circuit comprising:

a plurality i (i is an integer of 4 or more) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant signal outputting circuit for outputting a constant output signal;

a constant level signal generating circuit for providing the constant level signal to each of the i differential amplifiers, wherein:

first, second, third and fourth differential amplifiers of the i differential amplifiers are set to have the constant level signals at increasingly higher levels inputted in order;

the output signals of the first and second differential amplifiers and those of the third and fourth differential amplifiers are set to be of mutually reverse polarity; and thus constituted to form the output signal of the component of an m-th order function (m is an even number of 4 or more) on adding up the output signals of the differential amplifiers; and the constant signal outputting circuit is constituted to form the output signal of a 0-th order component for offsetting the 0-th order component of the m-th order function component so as to generate the component of the m-th order function including no 0-th order component by adding the output signals of the i differential amplifiers and the constant signal outputting circuit for having the linear input signal inputted and a second variable gain amplifying circuit for having an output signal of the m-th order component generating circuit inputted; and an adding circuit for adding the output signals of the 0-th order component generating portion, the linear component generating portion, the k-th order component generating portion and the m-th order component generating portion, wherein an approximate n-th order function (n is an integer of 4 or more) is generated.

12. An approximate cubic function generating device, comprising:

a 0-th order component generating portion for having a constant input signal inputted and generating a constant component;

a linear component generating portion for having a linear input signal inputted and generating a linear component;

a cubic component generating portion having a cubic component generating circuit comprising:

a plurality i (i=5) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant level signal generating circuit for providing the constant level signal to each of the i differential amplifiers, wherein:

first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;

a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;

each of (i–4) differential amplifiers other than the first, second and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i–4) differential amplifiers and those of the second differential amplifier are set to be of mutually reverse polarity; and thus constituted to form the output signal of the component of a k-th order function (k=3) on adding up the output signals of the first, second, third and (i–4) differential amplifiers; and the fourth differential amplifier is constituted to form the output signal of a linear component for offsetting the linear component of the k-th order function component so as to generate the component of the k-th order function including no linear component by adding the output signals of the i differential amplifiers for having the linear input signal inputted and a first variable gain amplifying circuit for having an output signal of the cubic component generating circuit inputted; and an adding circuit for adding the output signals of the 0-th order component generating portion, the linear component generating portion and the cubic component generating portion.

13. An approximate fourth order function generating device, comprising:

a 0-th order component generating portion for having a constant input signal inputted and generating a constant component;

a linear component generating portion for having a linear input signal inputted and generating a linear component;

a cubic component generating portion having a cubic component generating circuit comprising:

a plurality i (i=5) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant level signal generating circuit for providing the constant level signal to each of the i differential amplifiers, wherein:

first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;

a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;

each of (i–4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i–4) differential amplifiers and those of the second differential amplifier are set to be of mutually reverse polarity; and thus constituted to form the output signal of the component of a k-th order function (k=3) on adding un the output signals of the first, second, third and (i–4) differential amplifiers; and the fourth differential amplifier is constituted to form the output signal of a linear component for offsetting the linear component of the k-th order function component so as to generate the component of the k-th order function including no linear component by adding the output signals of the i differential amplifiers for having the linear input signal inputted and a first variable gain amplifying circuit for having an output signal of the cubic component generating circuit inputted;

a fourth order component generating portion having a fourth order component generating circuit comprising:

a plurality j (j=4) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant signal outputting circuit for outputting a constant output signal;

a constant level signal generating circuit for providing the constant level signal to each of the j differential amplifiers, wherein:

first, second, third and fourth differential amplifiers of the j differential amplifiers are set to have the constant level signals at increasingly higher levels inputted in order;

the output signals of the first and second differential amplifiers and those of the third and fourth differential amplifiers are set to be of mutually reverse polarity; and thus constituted to form the output signal of the component of an m-th order function (m=4) on adding up the output signals of the j differential amplifiers; and the constant signal outputting circuit is constituted to form the output signal of a 0-th order component for offsetting the 0-th order component of the m-th order function component so as to generate the component of the m-th order function including no 0-th order component by adding the output signals of the j differential amplifiers and the constant signal outputting circuit for having the linear input signal inputted and a second variable gain amplifying circuit for having an output signal of the fourth order component generating circuit inputted; and an adding circuit for adding the output signals of the fourth order component generating portion, the cubic component generating portion, the linear component generating portion and the 0-th order component generating portion.

14. An approximate fifth order function generating device, comprising:

a 0-th order component generating portion for having a constant input signal inputted and generating a constant component;

a linear component generating portion for having a linear input signal inputted and generating a linear component;

a cubic component generating portion having a cubic component generating circuit comprising:

a plurality i (i=5) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant level signal generating circuit for providing the constant level signal to each of the i differential amplifiers, wherein:

first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;

a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;

each of (i–4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i–4) differential amplifiers and those of the second differential amplifier are set to be of mutually reverse polarity; and thus constituted to form the output signal of the component of a k-th order function (k=3) on adding up the output signals of the first, second, third and (i–4) differential amplifiers; and the fourth differential amplifier is constituted to form the output signal of a linear component for offsetting the linear component of the k-th order function component so as to generate the component of the k-th order function including no linear component by adding the output signals of the i differential amplifiers for having the linear input signal inputted and a first variable gain amplifying circuit for having an output signal of the cubic component generating circuit inputted;

a fourth order component generating portion having a fourth order component generating circuit comprising:

a plurality j (j=4) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant signal outputting circuit for outputting a constant output signal;

a constant level signal generating circuit for providing the constant level signal to each of the j differential amplifiers, wherein:

first, second, third and fourth differential amplifiers of the j differential amplifiers are set to have the constant level signals at increasingly higher levels inputted in order;

the output signals of the first and second differential amplifiers and those of the third and fourth differential amplifiers are set to be of mutually reverse polarity; and thus constituted to form the output signal of the component of an m-th order function (m=4) on adding un the output signals of the j differential amplifiers; and the constant signal outputting circuit is constituted to form the output signal of a 0-th order component for offsetting the 0-th order component of the m-th order function component so as to generate the component of the m-th order function including no 0-th order component by adding the output signals of the j differential amplifiers and the constant signal outputting circuit for having the linear input signal inputted and a second variable gain amplifying circuit for having an output signal of the fourth order component generating circuit inputted;

a fifth order component generating portion having a fifth order component generating circuit comprising:

a plurality i (i=6) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant level signal generating circuit for providing the constant level signal to each of the i differential amplifiers, wherein:

first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;

a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;

each of (i–4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i–4) differential amplifiers and those of the second differential amplifier are set to be of mutually reverse polarity; and thus constituted to form the output signal of the component of a k-th order function (k=5) on adding up the output signals of the first, second, third and (i–4) differential amplifiers; and the fourth differential amplifier is constituted to form the output signal of a linear component for offsetting the linear component of the k-th order function component so as to generate the component of the k-th order function including no linear component by adding the output signals of the i differential amplifiers for having the linear input signal inputted and a third variable gain amplifying circuit for having an output signal of the fifth order component generating circuit inputted; and an adding circuit for adding the output signals of the fifth order component generating portion, the fourth order component generating portion, the cubic component generating portion, the linear component generating portion and the 0-th order component generating portion.

15. An approximate n-th order function generating device, comprising means for inputting a linear input signal, and means for outputting an n-th output signal proportional to an n-th order function represented by an n-th order polynomial and including no second order term in the n-th order polynomial, wherein n is an integer of 4 or more.

16. A temperature function generating circuit, comprising a temperature detecting circuit and an approximate n-th order function generating device comprising means for inputting a linear input signal, and means for outputting an n-th output signal proportional to an n-th order function represented by an n-th order polynomial and including no second order term in the n-th order polynomial, wherein n is an integer of 4 or more for having a detection signal of the temperature detecting circuit inputted.

17. A temperature compensation crystal oscillation circuit, comprising a temperature function generating circuit comprising a temperature detecting circuit and an approximate n-th order function generating device comprising means for inputting a linear input signal, and means for outputting an n-th output signal proportional to an n-th order function represented by an n-th order polynomial and including no second order term in the n-th order polynomial. wherein n is an integer of 4 or more and a crystal oscillation circuit for having the approximate n-th order function generated in the temperature function generating circuit inputted.

18. A temperature function generating circuit, comprising a temperature detecting circuit and an approximate n-th order function generating device comprising:
- a 0-th order component generating portion for having a constant signal inputted and generating a constant component;
- a linear component generating portion for having a linear input signal inputted and generating a linear component;
- at least one k-th order component generating portion having a k-th order component (k is an odd number of 3 or more) generating circuit for having the linear input signal inputted and a first variable gain amplifying circuit for having an output signal of the k-th order component generating circuit inputted;
- at least one m-th order component generating portion having an m-th order component (m is an even number of 4 or more) generating circuit for having the linear input signal inputted and a second variable gain amplifying circuit for having an output signal of the m-th order component generating circuit inputted; and
- an adding circuit for adding the output signals of the 0-th order component generating portion, the linear component generating portion, the k-th order component generating portion and the m-th order component generating portion, wherein an approximate n-th order function (n is an integer of 4 or more) is generated for having a detection signal of the temperature detecting circuit inputted.

19. A temperature compensation crystal oscillation circuit, comprising a temperature function generating circuit comprising:
- a 0-th order component generating portion for having a constant signal inputted and generating a constant component;
- a linear component generating portion for having a linear input signal inputted and generating a linear component;
- at least one k-th order component generating portion having a k-th order component (k is an odd number of 3 or more) generating circuit for having the linear input signal inputted and a first variable gain amplifying circuit for having an output signal of the k-th order component generating circuit inputted;
- at least one m-th order component generating portion having an m-th order component (m is an even number of 4 or more) generating circuit for having the linear input signal inputted and a second variable gain amplifying circuit for having an output signal of the m-th order component generating circuit inputted; and
- an adding circuit for adding the output signals of the 0-th order component generating portion, the linear component generating portion, the k-th order component generating portion and the m-th order component generating portion, wherein an approximate n-th order function (n is an integer of 4 or more) is generated for having a detection signal of the temperature detecting circuit inputted and a crystal oscillation circuit for having the approximate n-th order function generated in the temperature function generating circuit inputted.

20. A temperature function generating circuit, comprising a temperature detecting circuit and an approximate cubic function generating device comprising:
- a 0-th order component generating portion for having a constant input signal inputted and generating a constant component;
- a linear component generating portion for having a linear input signal inputted and generating a linear component;
- a cubic component generating portion having a cubic component generating circuit comprising:
- a plurality i (i=5) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and
- a constant level signal generating circuit for providing the constant level signal to each of the i differential amplifiers, wherein:
- first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;
- a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;

each of (i−4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i−4) differential amplifiers and those of the second differential amplifier are set to be of mutually reverse polarity; and thus constituted to form the output signal of the component of a k-th order function (k=3) on adding up the output signals of the first, second, third and (i−4) differential amplifiers; and the fourth differential amplifier is constituted to form the output signal of a linear component for offsetting the linear component of the k-th order function component so as to generate the component of the k-th order function including no linear component by adding the output signals of the i differential amplifiers for having the linear input signal inputted and a first variable gain amplifying circuit for having an output signal of the cubic component generating circuit inputted; and an adding circuit for adding the output signals of the 0-th order component generating portion, the linear component generating portion and the cubic component generating portion for having a detection signal of the temperature detecting circuit inputted.

21. A temperature compensation crystal oscillation circuit, comprising a temperature function generating circuit comprising a temperature detecting circuit and an approximate cubic function generating device comprising:

a 0-th order component generating portion for having a constant input signal inputted and generating a constant component;

a linear component generating portion for having a linear input signal inputted and generating a linear component;

a cubic component generating portion having a cubic component generating circuit comprising:

a plurality i (i=5) of differential amplifiers for having a common linear input signal inputted to one input terminal, having a constant level signal of a predetermined level inputted to the other input terminal, outputting a reversed or non-reversed signal to the linear input signal and having a limiter function of limiting an output signal to predetermined maximum and minimum values; and a constant level signal generating circuit for providing the constant level signal to each of the i differential amplifiers, wherein:

first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;

a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;

each of (i−4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i−4) differential amplifiers and those of the second differential amplifier are set to be of mutually reverse polarity; and thus constituted to form the output signal of the component of a k-th order function (k=3) on adding un the output signals of the first, second, third and (i−4) differential amplifiers; and the fourth differential amplifier is constituted to form the output signal of a linear component for offsetting the linear component of the k-th order function component so as to generate the component of the k-th order function including no linear component by adding the output signals of the i differential amplifiers for having the linear input signal inputted and a first variable gain amplifying circuit for having an output signal of the cubic component generating circuit inputted; and an adding circuit for adding the output signals of the 0-th order component generating portion, the linear component generating portion and the cubic component generating portion and a crystal oscillation circuit for having the approximate cubic function generated in the temperature function generating circuit inputted.

22. A temperature function generating circuit, comprising a temperature detecting circuit and an approximate fourth order function generating device comprising:

a 0-th order component generating portion for having a constant input signal inputted and generating a constant component;

a linear component generating portion for having a linear input signal inputted and generating a linear component;

a cubic component generating portion having a cubic component generating circuit comprising:

a plurality i (i=5) of differential amplifiers for having a common linear input signal inputted to one input terminal, having a constant level signal of a predetermined level inputted to the other input terminal, outputting a reversed or non-reversed signal to the linear input signal and having a limiter function of limiting an output signal to predetermined maximum and minimum values; and a constant level signal generating circuit for providing the constant level signal to each of the i differential amplifiers, wherein:

first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;

a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;

each of (i–4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i–4) differential amplifiers and those of the second differential amplifier are set to be of mutually reverse polarity; and thus constituted to form the output signal of the component of a k-th order function (k=3) on adding up the output signals of the first, second, third and (i–4) differential amplifiers; and the fourth differential amplifier is constituted to form the output signal of a linear component for offsetting the linear component of the k-th order function component so as to generate the component of the k-th order function including no linear component by adding the output signals of the i differential amplifiers for having the linear input signal inputted and a first variable gain amplifying circuit for having an output signal of the cubic component generating circuit inputted;

a fourth order component generating portion having a fourth order component generating circuit comprising:

a plurality j (j=4) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant signal outputting circuit for outputting a constant output signal;

a constant level signal generating circuit for providing the constant level signal to each of the j differential amplifiers, wherein:

first, second, third and fourth differential amplifiers of the j differential amplifiers are set to have the constant level signals at increasingly higher levels inputted in order;

the output signals of the first and second differential amplifiers and those of the third and fourth differential amplifiers are set to be of mutually reverse polarity; and thus constituted to form the output signal of the component of an m-th order function (m=4) on adding up the output signals of the j differential amplifiers; and the constant signal outputting circuit is constituted to form the output signal of a 0-th order component for offsetting the 0-th order component of the m-th order function component so as to generate the component of the m-th order function including no 0-th order component by adding the output signals of the j differential amplifiers and the constant signal outputting circuit for having the linear input signal inputted and a second variable gain amplifying circuit for having an output signal of the fourth order component generating circuit inputted; and an adding circuit for adding the output signals of the fourth order component generating portion, the cubic component generating portion, the linear component generating portion and the 0-th order component generating portion for having a detection signal of the temperature detecting circuit inputted.

23. A temperature compensation crystal oscillation circuit, comprising a temperature function generating circuit comprising a temperature detecting circuit and an approximate fourth order function generating device comprising:

a 0-th order component generating portion for having a constant input signal inputted and generating a constant component;

a linear component generating portion for having a linear input signal inputted and generating a linear component;

a cubic component generating portion having a cubic component generating circuit comprising:

a plurality i (i=5) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant level signal generating circuit for providing the constant level signal to each of the i differential amplifiers, wherein:

first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;

a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;

each of (i–4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i–4) differential amplifiers and those of the second differential amplifier are set to be of mutually reverse polarity; and thus constituted to form the output signal of the component of a k-th order function (k=3) on adding up the output signals of the first, second, third and (i–4) differential amplifiers; and the fourth differential amplifier is constituted to form the output signal of a linear component for offsetting the linear component of the k-th order function component so as to generate the component of the k-th order function including no linear component by adding the output signals of the i differential amplifiers for having the linear input signal inputted and a first variable gain amplifying circuit for having an output signal of the cubic component generating circuit inputted;

a fourth order component generating portion having a fourth order component generating circuit comprising:

a plurality j (j=4) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant signal outputting circuit for outputting a constant output signal;

a constant level signal generating circuit for providing the constant level signal to each of the j differential amplifiers, wherein:

first, second, third and fourth differential amplifiers of the j differential amplifiers are set to have the constant level signals at increasingly higher levels inputted in order;

the output signals of the first and second differential amplifiers and those of the third and fourth differential amplifiers are set to be of mutually reverse polarity; and thus constituted to form the output signal of the component of an m-th order function (m=4) on adding up the output signals of the j differential amplifiers; and the constant signal outputting circuit is constituted to form the output signal of a 0-th order component for offsetting the 0-th order component of the m-th order function component so as to generate the component of the m-th order function including no 0-th order component by adding the output signals of the j differential amplifiers and the constant signal outputting circuit for having the linear input signal inputted and a second variable gain amplifying circuit for having an output signal of the fourth order component generating circuit inputted; and an adding circuit for adding the output signals of the fourth order component generating portion, the cubic component generating portion, the linear component generating portion and the 0-th order component generating portion for having a detecting signal of the temperature detecting circuit inputted and a crystal oscillation circuit for having the approximate fourth order function generated in the temperature function generating circuit inputted.

24. A temperature function generating circuit, comprising a temperature detecting circuit and an approximate fifth order function generating device comprising:

a 0-th order component generating portion for having a constant input signal inputted and generating a constant component;

a linear component generating portion for having a linear input signal inputted and generating a linear component;

a cubic component generating portion having a cubic component generating circuit comprising:

a plurality i (i=5) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant level signal generating circuit for providing the constant level signal to each of the i differential amplifiers, wherein:

first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;

a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;

each of (i−4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i−4) differential amplifiers and those of the second differential amplifier are set to be of mutually reverse polarity; and thus constituted to form the output signal of the component of a k-th order function (k=3) on adding up the output signals of the first, second, third and (i−4) differential amplifiers; and the fourth differential amplifier is constituted to form the output signal of a linear component for offsetting the linear component of the k-th order function component so as to generate the component of the k-th order function including no linear component by adding the output signals of the i differential amplifiers for having the linear input signal inputted and a first variable gain amplifying circuit for having an output signal of the cubic component generating circuit inputted;

a fourth order component generating portion having a fourth order component generating circuit comprising:

a plurality j (j=4) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant signal outputting circuit for outputting a constant output signal;

a constant level signal generating circuit for providing the constant level signal to each of the j differential amplifiers, wherein:

first, second, third and fourth differential amplifiers of the j differential amplifiers are set to have the constant level signals at increasingly higher levels inputted in order;

the output signals of the first and second differential amplifiers and those of the third and fourth differential amplifiers are set to be of mutually reverse polarity; and thus constituted to form the output signal of the component of an m-th order function (m=4) on adding up the output signals of the j differential amplifiers; and the constant signal outputting circuit is constituted to form the output signal of a 0-th order component for offsetting the 0-th order component of the m-th order function component so as to generate the component of the m-th order function including no 0-th order component by adding the output signals of the j differential amplifiers and the constant signal outputting circuit for having the linear input signal inputted and a second variable gain amplifying circuit for having an output signal of the fourth order component generating circuit inputted;

a fifth order component generating portion having a fifth order component generating circuit comprising:

a plurality i (i=6) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant level signal generating circuit for providing the constant level signal to each of the i differential amplifiers, wherein:

first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;

a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;

each of (i−4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i−4) differential amplifiers and those of the second differential amplifier are set to be of mutually reverse polarity; and thus constituted to form the output signal of the component of a k-th order function (k=5) on adding up the output signals of the first, second, third and (i−4) differential amplifiers; and the fourth differential amplifier is constituted to form the output signal of a linear component for offsetting the linear component of the k-th order function component so as to generate the component of the k-th order function including no linear component by adding the output signals of the i differential amplifiers for having the linear input signal inputted and a third variable gain amplifying circuit for having an output signal of the fifth order component generating circuit inputted; and an adding circuit for adding the output signals of the fifth order component generating portion, the fourth order component generating portion, the cubic component generating portion, the linear component generating portion and the 0-th order component generating portion for having a detection signal of the temperature detecting circuit inputted.

25. A temperature compensation crystal oscillation circuit, comprising a temperature function generating circuit comprising a temperature detecting circuit and an approximate fifth order function generating device comprising:

a 0-th order component generating portion for having a constant input signal inputted and generating a constant component;

a linear component generating portion for having a linear input signal inputted and generating a linear component;

a cubic component generating portion having a cubic component generating circuit comprising;

a plurality i (i=5) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant level signal generating circuit for providing the constant level signal to each of the i differential amplifiers, wherein:

first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;

a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;

each of (i−4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i−4) differential amplifiers and those of the second differential amplifier are set to be of mutually reverse polarity; and thus constituted to form the output signal of the component of a k-th order function (k=3) on adding up the output signals of the first, second, third and (i−4) differential amplifiers; and the fourth differential amplifier is constituted to form the output signal of a linear component for offsetting the linear component of the k-th order function component so as to generate the component of the k-th order function including no linear component by adding the output signals of the i differential amplifiers for having the linear input signal inputted and a first variable gain amplifying circuit for having an output signal of the cubic component generating circuit inputted;

a fourth order component generating portion having a fourth order component generating circuit comprising:

a plurality j (j=4) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant signal outputting circuit for outputting a constant output signal;

a constant level signal generating circuit for providing the constant level signal to each of the j differential amplifiers, wherein:

first, second, third and fourth differential amplifiers of the j differential amplifiers are set to have the constant level signals at increasingly higher levels inputted in order;

the output signals of the first and second differential amplifiers and those of the third and fourth differential amplifiers are set to be of mutually reverse polarity; and thus constituted to form the output signal of the component of an m-th order function (m=4) on adding up the output signals of the j differential amplifiers; and the constant signal outputting circuit is constituted to form the output signal of a 0-th order component for offsetting the 0-th order component of the m-th order function component so as to generate the component of the m-th order function including no 0-th order component by adding the output signals of the j differential amplifiers and the constant signal outputting circuit for having the linear input signal inputted and a second variable gain amplifying circuit for having an output signal of the fourth order component generating circuit inputted;

a fifth order component generating portion having a fifth order component generating circuit comprising:

a plurality i (i=6) of differential amplifiers for having a common linear input signal inputted to one input terminal, having a constant level signal of a predetermined level inputted to the other input terminal, outputting an reversed or non-reversed signal to the linear input signal and having a limiter function of limiting an output signal to predetermined maximum and minimum values; and a constant level signal generating circuit for providing the constant level signal to each of the i differential amplifiers, wherein:

first, second and third differential amplifiers of the i differential amplifiers are set to have the constant level signals at increasingly higher levels inputted in order, and the output signals of the first and third differential amplifiers and those of the second differential amplifier are set to be of mutually reverse polarity;

a fourth differential amplifier of the i differential amplifiers has the constant level signal to be inputted set as the signal at the same level as the constant level signal to be inputted to the second differential amplifier, and has the output signal thereof set to be of the same polarity as the output signals of the first and third differential amplifiers and also has a range of the input signal to be the maximum value and the input signal to be the minimum value set larger than that of the second differential amplifier;

each of (i−4) differential amplifiers other than the first, second, third and fourth differential amplifiers of the i differential amplifiers has the constant level signal to be inputted set to be either lower than a level of the constant level signal to be inputted to the first differential amplifier or higher than a level of the constant level signal to be inputted to the third differential amplifier, and the output signals of the (i−4) differential amplifiers and those of the second differential amplifier are set to be of mutually reverse polarity; and thus constituted to form the output signal of the component of a k-th order function (k=5) on adding up the output signals of the first, second, third and (i−4) differential amplifiers; and the fourth differential amplifier is constituted to form the output signal of a linear component for offsetting the linear component of the k-th order function component so as to generate the component of the k-th order function including no linear component by adding the output signals of the i differential amplifiers for having the linear input signal inputted and a third variable gain amplifying circuit for having an output signal of the fifth order component generating circuit inputted; and an adding circuit for adding the output signals of the fifth order component generating portion, the fourth order component generating portion, the cubic component generating portion, the linear component generating portion and the 0-th order component generating portion for having a detection signal of the temperature detecting circuit inputted and a crystal oscillation circuit for having the approximate fifth order function generated in the temperature function generating circuit inputted.

26. A temperature compensation adjustment method, comprising, when making a temperature compensation adjustment to a temperature compensation crystal oscillation circuit comprised of a temperature compensation circuit including a temperature detecting circuit and an approximate n-th order function generating device (n is an integer of 3 or more) and a voltage-controlled crystal oscillation circuit, making a measurement on an n-th order component $VC_{OUTn}$ to a 0-th order component $VC_{OUT0}$ of an output voltage $VC_{OUT}$ of the temperature compensation circuit in a predetermined temperature atmosphere, and also making measurements at a plurality of temperatures in a desired temperature compensation range, on an input voltage $VC_{IN}$ at which an oscillating frequency outputted from the voltage-controlled crystal oscillation circuit matches a preset selected frequency, wherein the n-th order component $VC_{OUTn}$ of the output voltage $VC_{OUT}$ measured at each temperature is approximated as a function of a temperature T by:

$$VC_{OUTn}'(T) = VC_{OUTn}(T) - VC_{OUT0}(T),$$

and the output voltage $VC_{OUT}$ is described as a function of the temperature T by:

$$VC_{OUT}(T) = \alpha_n VC'_{OUTn}(T + \Delta T) + \ldots + \alpha_3 VC'_{OUT3}(T + \Delta T) + \alpha_1 VC'_{OUT1}(T + \Delta T) + VC'_{OUT0}(T + \Delta T) + \alpha_0,$$

and coefficients $\alpha_n$ to $\alpha_3$, $\alpha_1$, $\alpha_0$ and $\Delta T$ of the temperature compensation circuit are adjusted so that the input voltage $VC_{IN}$ and the output voltage $VC_{OUT}$ measured at each of the temperatures are matching.

27. The approximate cubic function generating circuit according to claim 12, wherein a fifth differential amplifier has the constant level signal to be inputted set to be higher than the level of the constant level signal to be inputted to the third differential amplifier and also has the range of the input signal to be the maximum value and the input signal to be the minimum value set smaller than that of the third differential amplifier.

28. The approximate fourth order function generating circuit according to claim 13, wherein a fifth differential amplifier has the constant level signal to be inputted set to be higher than the level of the constant level signal to be inputted to the third differential amplifier and also has the range of the input signal to be the maximum value and the input signal to be the minimum value set smaller than that of the third differential amplifier.

29. The approximate fifth order function generating circuit according to claim 14, wherein a fifth differential amplifier has the constant level signal to be inputted set to be higher than the level of the constant level signal to be inputted to the third differential amplifier and also has the range of the input signal to be the maximum value and the input signal to be the minimum value set smaller than that of the third differential amplifier.

* * * * *

UNITED STATES PATENT AND TRADEMARK OFFICE
CERTIFICATE OF CORRECTION

PATENT NO. : 7,154,351 B2 Page 1 of 1
APPLICATION NO. : 10/523996
DATED : December 26, 2006
INVENTOR(S) : Takako Kawasaki et al.

It is Certified that error appears in the above-identified patent and that said Letters Patent is hereby CorreCted as shown below:

Column 27, line 48, "i" should read -- j --.

Column 27, lines 59 and 63, "i" should read -- j --.

Column 28, line 4, insert -- j -- before "differential".

Column 28, line 10, "i" should read -- j --.

Column 30, line 2, "un" should read -- up --.

Signed and Sealed this

Twenty-second Day of May, 2007

JON W. DUDAS
*DireCtor of the United States Patent and Trademark OffiCe*